(12) United States Patent
Sager et al.

(10) Patent No.: US 6,946,597 B2
(45) Date of Patent: Sep. 20, 2005

(54) PHOTOVOLTAIC DEVICES FABRICATED BY GROWTH FROM POROUS TEMPLATE

(75) Inventors: Brian M. Sager, Palo Alto, CA (US); Martin R. Roscheisen, San Francisco, CA (US); Klus Petritsch, Foster City, CA (US); Karl Pichler, Santa Clara, CA (US); Jacqueline Fidanza, San Francisco, CA (US); Dong Yu, Fremont, CA (US)

(73) Assignee: Nanosular, Inc., Palo Alto, CA (US)

( * ) Notice: Subject to any disclaimer, the term of this patent is extended or adjusted under 35 U.S.C. 154(b) by 85 days.

(21) Appl. No.: 10/443,456

(22) Filed: May 21, 2003

(65) Prior Publication Data

US 2005/0121068 A1 Jun. 9, 2005

Related U.S. Application Data

(63) Continuation-in-part of application No. 10/290,119, filed on Nov. 5, 2002, and a continuation-in-part of application No. 10/303,665, filed on Nov. 22, 2002, and a continuation-in-part of application No. 10/319,406, filed on Dec. 11, 2002.
(60) Provisional application No. 60/390,904, filed on Jun. 22, 2002.

(51) Int. Cl.[7] .................. H01L 31/0352; H01L 31/0256
(52) U.S. Cl. .......................... 136/263; 136/255; 136/256; 257/40; 257/465; 257/466; 257/464; 257/461; 438/82; 438/71; 438/88; 438/57
(58) Field of Search ................................. 136/263, 265, 136/256, 255; 257/40, 465, 466, 464, 461; 438/82, 71, 88, 57

(56) References Cited

U.S. PATENT DOCUMENTS 5,482,570 A  1/1996  Saurer et al. ............... 136/255
5,525,440 A  6/1996  Kay et al. ................... 429/111
5,571,612 A * 11/1996 Motohiro et al. ........... 428/323
5,674,325 A  10/1997 Albright et al. ............. 126/250
5,986,206 A  11/1999 Kambe et al. .............. 136/263
5,990,415 A  11/1999 Green et al. ................ 136/255

(Continued)

FOREIGN PATENT DOCUMENTS

DE        2741954 A1  *  3/1979
EP        1028475 A1  *  8/2000
EP        1087446 A2  *  3/2001
WO     WO 02/084708        10/2002

OTHER PUBLICATIONS

M. Granstrom, K. Petritsch, A. C. Arias, A. Lux, M. R. Andersson & R. H. Friend. 1998. Laminated fabrication of polymeric photovoltaic diodes. Nature 395, 257–260.

(Continued)

*Primary Examiner*—Alan Diamond
(74) *Attorney, Agent, or Firm*—JDI Patent; Joshua D. Isenberg

(57) ABSTRACT

Photovoltaic devices, such as solar cells, and methods for their manufacture are disclosed. A device may be characterized by an architecture where two more materials having different electron affinities are regularly arrayed such that their presence alternates within distances of between about 1 nm and about 100 nm. The materials are present in a matrix based on a porous template with an array of template pores. The porous template is formed by anodizing a layer of metal. A photovoltaic device may include such a porous template disposed between a base electrode and a transparent conducting electrode. A first charge-transfer material fills the template pores, A second (complementary) charge-transfer material fills additional space not occupied by the first charge-transfer material.

59 Claims, 8 Drawing Sheets

U.S. PATENT DOCUMENTS

| | | | | |
|---|---|---|---|---|
| 6,075,203 | A | 6/2000 | Wang et al. | 136/256 |
| 6,270,846 | B1 | 8/2001 | Brinker et al. | 427/385.5 |
| 6,278,056 | B1 | 8/2001 | Sugihara et al. | 136/263 |
| 6,291,763 | B1 | 9/2001 | Nakamura | 136/256 |
| 6,340,789 | B1 | 1/2002 | Petritsch et al. | 136/263 |
| 2002/0017656 | A1 | 2/2002 | Graetzel et al. | 257/184 |
| 2002/0134426 | A1 | 9/2002 | Chiba et al. | 136/263 |
| 2002/0192441 | A1 * | 12/2002 | Kalkan et al. | 428/209 |
| 2003/0226498 | A1 | 12/2003 | Alivisatos et al. | 117/84 |
| 2004/0084080 | A1 * | 5/2004 | Sager et al. | 136/263 |
| 2004/0118448 | A1 | 6/2004 | Scher et al. | 136/252 |
| 2004/0146560 | A1 | 7/2004 | Whitford et al. | 424/484 |
| 2004/0178390 | A1 | 9/2004 | Whitford et al. | 252/500 |

OTHER PUBLICATIONS

Gebeyehu, D., Brabec, C.J., Saricifti, N.S., Vangeneugden, D., Kiebooms, R., Vanderzande, D., Kienberger, F., and H. Schnindler. 2002. Hybrid Solar Cells based on dye–sensitized nanoporous TiO2 electrods and conjugated polymers as hole transport materials. Synthetic Metals 123, 279–287, (2002).

Greg P. Smestad, Stefan Spiekermann, Janusz Kowalik, Christian D. Grant, Adam M. Schwartzberg, Jin Zhang, Laren M. Tolbert, and Ellen Moons. 2002. A technique to compare polythiophene solid–state dye sensitized TiO2 solar cells to liquid junction devices.Solar Energy Materials & Solar Cells, in press, date unknown.

Hongyou Fan, Yunfeng Lu, Aaron Stump, Scott T. Reed, Tom Baer, Randy Schunk, Victor Perez–Luna, Gabriel P. Lopez & C. Jeffrey Brinker. 2000. Rapid prototyping of patterned functional nanostructures, Nature 405, 56–60, May 2000.

Alan Sellinger, Pilar M.Weiss, Anh Nguyen, Yunfeng Lu, Roger A. Assink, Weiliang Gong & C. Jeffrey Brinker. 1998. Continuous self–assembly of organic–inorganic nanocomposite coatings that mimic nacre. Nature 394, 256–260, Jul. 1998.

Yunfeng Lu, Rahul Ganguli, Celeste A. Drewien, Mark T. Anderson, C. Jeffrey Brinker, Weilang Gong, Yongxing Guo, Hermes Soyez, Bruce Dunn, Michael H. Huang & Jeffrey I. Zink. 1997. Continuous formation of supported cubic and hexagonal mesoporous films by sol–gel dip–coating. Science 288, 652–656.

L. Schmidt–Mende, A. Fechtenkotter, K. Mullen, E. Moons, R. H. Friend, J. D. MacKenzie. 2002. Self–Organized Discotic Liquid Crystals for High–Efficiency Organic Photovoltaics. Science 293, 1119–1122, Aug. 2001.

Wendy U. Huynh, Janke J. Dittmer, A. Paul Alivisatos. 2002. Hybrid Nanorod–PolymerSolar Cells. Science 295, 2425–2427, Mar. 2002.

Thuc–Quyen Nguyen, Junjun Wu, Vinh Doan, Benjamin J. Schwartz, Sarah H. Tolbert. 2000. Control of Energy Transfer in Oriented Conjugated Polymer–Mesoporous Silica Composites. Science 288, 652–656, Apr. 2000.

Heeger, A.J. 2002 Semiconducting and metallic polymers: the fourth and fifth generation of polymeric materials. Synthetic Metals 125, 23–42 (2002).

Michael H. Huang, Amer Choudrey and Peidong Yang, "Ag Nanowire Formation within Mesoporous Silica" Chem. Commun., 2000, 1063–1064.

Andrew A. Gewirth, Panos C. Andricacos, and Jay A. Switzer, with John O. Dukovic, editor "Hot Topics in Electrodeposition", The Electrochemical Society Interface • Spring 1998.

Heini Saloniemi, "Electrodeposition of PbS, PbSe and PbTe Thin Films" by Heini Saloniemi, VTT Publications 423, Dec. 15, 2000, an electronic copy of which may be accessed at http://www.inf.vtt.fi/pdf/publications/2000/P423.pdf.

Huang Y, Duan, X, Wei, Q, & C.M. Lieber, "Directed Assembly Of One–Dimensional Nanostructures Into Functional Networks" Science 291(5504):630–633 (2001).

Byung Hee Hong, Sung Chul Bae, Chi–Wan Lee, Sukmin Jeong, and Kwang S. Kim, "Ultrathin Single–Crystalline Silver Nanowire Arrays Formed in an Ambient Solution Phase", Science 294: 348–351; Published online Sep. 6, 2001.

Justin D. Holmes, Keith P. Johnston, R. Christopher Doty, and Brian A. Korgel, "Control of Thickness and Orientation of Solution–Grown Silicon Nanowires" Science Feb. 25, 2000; 287: 1471–1473.

Lu, Y., Yang, Y., Sellinger, A., Lu, M., Huang, J., Fan, H., Haddad, R., Lopez, G., Burns, A.R., Sasaki, D.Y., Shelnutt, J., and C. J. Brinker, "Self–Assembly of Mesoscopically Ordered Chromatic Polydiacetylene Nanocomposites", Nature 410: 913–917 (2001.).

Halls et al., "Efficient Photodiodes from interpenetrating Polymer Networks", Nature, vol. 376 Aug. 10, 1995.

O'Regan et al. "A Low–cost, High–efficiency solar cell based on dye–sensitized colloidal $TiO_2$ Films", Nature, vol. 353 pp737–740, Oct. 24, 1991.

Mapes et al., "Ionic Conductivities of Poly(siloxane) Polymer Electrolytes with Varying Length of Linear Ethoxy Sidechains, Different Molecular Weights, and Mixed Copolymers", Polymer Preprints, 41(1), pp 309–310 (2000).

Hooper et al., "A Highly Conductive Solid–State Polymer Electrolyte Based on a Double–Comb Polysiloxane Polymer with Oligo(ethylene oxide) Side Chains", Organometallics, vol. 18, No. 17, Aug. 16, 1999.

Nazeeruddin et al. "Conversion of Light to Electricity by cis–$X_2$Bis(2,2'–bipyridyl–4,4'–dicarboxylate) ruthenium(II) Charge–Transfer Sensitizers (X=Cl$^-$, BR$^-$, I$^-$, CN$^-$, and SCN$^-$) on Nanocrystalline $TiO_2$ Electrodes", Journal of the American Chemical Society 1993, 115, pp 6382–6390 (1993).

Green et al. "Solar Cell Efficiency Tables (version 11)", Proges in Photovoltaics: Research and Applications, 6, 35–42 (1998).

Gebeyehu et al, "Solid–State Organic/inorganic Hybrid Solar Cells Based on Conjugated Polymers and Dye–Sensitized $TiO_2$ Electrodes", Thin Solid Films, 403–404, pp 271–274 (2002).

Barbé et al., "Nancrystalline Titanium Oxide Electrodes for Photovoltaic Applications", Journal of the American Ceramic Society, 80 (12), pp 3157–3171 (1997).

A. P. Li et al., "Polycrystalline Nanopore Arrays with Hexagonal Ordering on Aluminum," Journal of Vacuum Science and Technology A 17(4) Jul./Aug. 1999.

M. Steinhart et al, "Polymer Nanotubes by Wetting of ordered Porous Templates," Science vol. 296, Jun. 14, 2002.

S.Z Chu et al., "Synthesis and Characterization of Titania Nanostructures on Glass by Al Anodization and Sol–Gel Process," Chem. Mater. 14, pp 266–272, 2002.

S.Z Chu et al., "Fabrication and Characteristics of Ordered Ni Nanostructures on Glass by Anodization and Direct Current Electrodeposition," *Chem. Mater.* 14, pp 4595–4602, 2002.

U.S. Appl. No. 10/290,119, filed Nov. 5, 2002, to Brian M. Sager et al., and entitled "Optoelectronic Device and Fabrication Methods".

U.S. Appl. No. 10/303,665, filed Nov. 22, 2002, to Martin R. Roscheisen et al. entitled "Molding Technique for Fabrication of Optoelectronic Devices".

U.S. Appl. No. 10/319,406, filed Dec. 11, 2002, to Brian M. Sager et al., and entitled "Nano–Architected/Assembled Solar Electricity Cell".

J. Kruger et al, "High Efficiency Solid–State Photovoltaic Device Due to Inhibition of Interface Charge Recombination," *Applied Physics Letters,* vol. 79, No. 13, 24, pp 2085–2087, Sep. 2001, American Institute of Physics, College Park, MD.

P. Wang, et al. "A Stable Quasi Solid–State Dye–Sensitized Solar Cell with an Amphiphillic Ruthenium Sensitizer and Polymer Gel Electrolyte", *Nature Materials,* vol. 2, Jun. 2003 pp 402–407 (Published online May 18, 2003), Nature Publishing Group, London, UK.

L. Drummy et al., "Direct Imaging of Defect Structures in Pentacene Nanocrystals" *Advanced Materials* vol. 14, No. 1, pp. 54–57 Jan. 4, 2002, Wiley–VCH, Verlag GmbH, Wienheim, Germany.

F. Cao, et al, "A Solid State, Dye Sensitized Photoelectrochemical Cell", *Journal of Physical Chemistry,* vol. 99, pp. 17071–17073, 1995.

B. O'Reagan, et al., "Large Enhancement in Photocurrent Efficiency Caused by UV Illumination of the Dye Sensitized Hereojunction TiO$_2$/RuLL'NCS/CuSCN: Initiation and Potential Mechanisms", *Chemical Materials,* vol. 10, pp. 1501–1509, published on the web, May 20, 1998, American Chemical Society, Washington, DC.

E. Strathatos et al, "A Quasi Solid State Dye Sensitized Solar Cell Based on a Sol Gel Nanocomposite Electrolyte Containing Ionic Liquid", *Chemical Materials,* vol. 15, pp. 1825–1829, published on the web, Apr. 5, 2003, American Chemical Society, Washington, DC.

K. Tennakone et al, "A Dye–Sensitized Nano–Porous Solid–State Photo Voltaic Cell" *Semiconductor Science and Technology,* vol. 10, pp. 1689–1693, IOP Publishing, UK 1995.

D. Gong et al., titanium oxide nanotube arrays prepared by anodic oxidation, in *J. Mater. Res.,* vol. 16, No. 12, pp. 3331–3334, Dec., 2001, Materials Research Society.

R. Beranek et al, "Self–Organized Porous Titanium Oxide Prepared in $H_2SO_4$/HF Electrolytes," in *Electrochemical and Solid–State Letters,* vol. 6, No. 3, pp B12–B14, Jan. 17, 2003, Electrochemical Society, Inc.

V. Zwilling et al., "Structure and Physiochemistry of Anodic Oxide Films on Titanium and TA6V Alloy," in *Surface and Interface Analysis,* vol. 27, pp 629–637, 1999, John Wiley and Sons, Ltd.

V. Zwilling et al., "Anodic oxidation of titanium and TAV6 alloy in chromic media. An electrochemical approach," in *Electrochemica Acta.* vol. 45, pp 921–929, 1999, Elsevier Science, Ltd.

Merriam Webster Online Dictionary entry for "template" [online], [retrieved on Jul. 16, 2004]. Retrieved from the Internet ,<URL: http://www.m–w.com/cgi–bin/dictionary?book=Dictionary&va=template>.

Merriam Webster Online Dictionary entry for "particulate" [online], [retrieved on Jun. 9, 2004]. Retrieved from the Internet ,<URL: http://www.m–w.com/cgi–bin/dictionary?book=Dictionary&va=particulate>.

* cited by examiner

PHOTOVOLTAIC DEVICES FABRICATED BY GROWTH FROM POROUS TEMPLATE

CROSS-REFERENCE TO RELATED APPLICATIONS

This application is a continuation-in-part of U.S. patent application Ser. No. 10/290,119 filed Nov. 5, 2002, and is a continuation-in-part of U.S. patent application Ser. No. 10/303,665 filed Nov. 22, 2002, and is a continuation-in-part of U.S. patent application Ser. No. 10/319,406 filed Dec. 11, 2002, the entire disclosures of all of which are incorporated herein by reference. This application also claims priority to U.S. Provisional Patent Application 60/390,904, filed Jun. 22, 2002, the entire disclosures of which are incorporated herein by reference.

FIELD OF THE INVENTION

This invention is directed to photovoltaic devices and methods for their production, and more specifically to nano-structured photovoltaic devices.

BACKGROUND OF THE INVENTION

In the prior art, inexpensive plastic solar cells based on exciton (bound electron/hole pairs) physics have been fabricated with AM1.5 efficiency of 2–3% (Huynh et al., "Hybrid Nanorod-Polymer Solar Cells", *Science* 295, 2425–2427 (2002); Schmidt-Mende et al, "Self-Organized Discotic Liquid Crystals for High-Efficiency Organic Photovoltaics", *Science* 293, 1119–1122 (2002). Shaheen et al. "2.5 Percent Efficient Organic Plastic Solar Cells," *Applied Physics Letters* 78, 841–843 (2001).

In these solar cell devices, however, the device architectures are suboptimal in terms of their nanometer-scale morphology, and improvements are needed to obtain higher-efficiency devices. In particular, the morphology of the active layer of a more optimal device would have an architecture of nanometer scale ordered interdigitation due to the nature of the exciton-based physics. The lifetime of migrating excitons is extremely short, and as such an exciton can typically diffuse only about 10 nm (or at most 10's of nm) before the electron and hole spontaneously (and non-productively) recombine. Thus, to separate the electron away from the hole with which it is bound (and ultimately generate electricity), an exciton must reach the junction to another material (one with higher electron affinity) within 10's of nm of where it was initially created. In solar-cell devices of the prior art, the morphology of the active layer has been quasi-random. For instance, in the Huynh et al. work, the nanorods are sprinkled across the polymer in which they are embedded; they often cluster into clumps of nanorods, producing some areas with more nanorods than ideal and other areas with fewer nanorods than ideal; and not all nanorods are fully connected so that islands may exists where charges are trapped (and even if full connectivity exists, charges generally cannot move out of the cell in a simple straight path, with interim recombination losses resulting). In the polymer-blend work of Schmidt-Mende and others, phase separation leads to a morphology of the active layer that is not well controlled, with islands and percolation paths that are not straight.

Finally, in devices of the prior art, the movement of charges through the active materials of the devices required regularly and closely spaced nanoparticles or nanorods which could collect and transport free electrons to the outer boundary of the active layer of the device, and the lack of uniform spacing in these devices decreased the hole and electron transport efficiency. All of these factors combine to reduce the device efficiency, and therefore the potential electricity that can be produced by a solar cell. Finally, devices of the prior art link materials choice with architecture, making it hard to optimize materials independent of shape.

Thus, there is a need in the art for a solar cell architecture/active-layer morphology that overcomes the above difficulties.

SUMMARY OF THE INVENTION

The disadvantages associated with the prior art are overcome by a new photovoltaic device design, methods for the manufacture of such devices, and uses for such devices.

According to embodiment of the present invention a solar cell device includes two or more materials having different electron affinities. The solar cell device is characterized by an architecture where the materials are regularly arrayed and their presence alternates within distances of between about 1 nm and about 100 nm. The materials are present in a matrix based on a porous template with an array of template pores. The porous template is formed by anodizing a metal substrate. One of the materials may be an organic material that absorbs light in its bulk.

According to another embodiment of the present invention, a photovoltaic (PV) device includes a porous template having an array of template pores and a first charge-transfer material that fills the template pores. A second charge-transfer material fills additional space not occupied by the first charge-transfer material. The second charge-transfer material has complementary charge-transfer characteristics with respect to the first charge-transfer material.

PV devices may be fabricated by anodizing a metal substrate to form a porous template having an array of template pores. The template pores are then filled with a first charge-transfer material. Additional space not occupied by the first charge-transfer material is then filled with a complementary charge-transfer material. The porous template can be made, e.g., by placing an aluminum or aluminum-coated substrate in an electrolyte, applying an anodizing voltage to the substrate to form an alumina film. The alumina film can subsequently be processed with additional voltage and/or chemical exposure.

In one embodiment, the first charge-transfer material may coat the template pores in a way that forms tubules having the additional space in the form of tubule pores. In an alternative embodiment, the porous template may be removed and replaced with a second charge-transfer material. In another alternative embodiment, the porous template itself may be initially made of a charge-transfer that is complementary to a charge-transfer material that fills the template pores.

DETAILED DESCRIPTION OF THE INVENTION

Figure 1A:
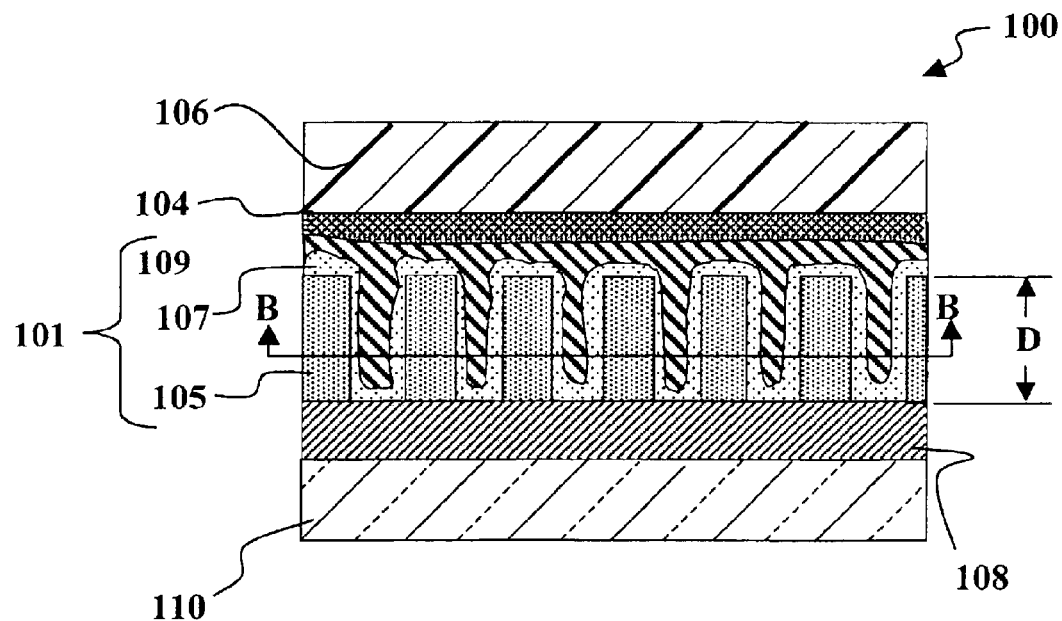
FIG. 1A shows a vertical cross-sectional schematic of a device according to an embodiment of the present invention.

Contents
I. Glossary
II. Introduction
III. General Overview
IV. Photovoltaic Device
V. Photovoltaic Device Fabrication
VI. Alternative Embodiments
VII. Conclusion I. Glossary The following terms are intended to have the following general meanings as they are used herein:

The article "A", or "An" refers to a quantity of one or more of the item following the article, except where expressly stated otherwise, e.g., "a single" layer.

Active Layer generally refers to the layer within a photovoltaic or solar cell device where conversion of radiant energy to electrical energy takes place.

Anodization refers to the formation of a film, such as an oxide, on a conducting material, such as a metal, by electrolysis.

Array refers to a regular arrangement of objects or structures over a scale of distance greater than some characteristic dimension of a typical structure or object in the array.

Aspect Ratio: refers to the ratio of pore height or depth to pore width.

Buckminsterfullerene or Fullerene: refers to molecular cages consisting, e.g., of only carbon atoms or mostly carbon atoms. The arrangement of the atoms is almost exclusively in the form of hexagons and pentagons. For example, 12 pentagons and 20 hexagons make a $C_{60}$ cage, which is 10 Å in diameter, with a 4-Å cavity. Fullerenes also have other useful forms, such as $C_{20}$, $C_{36}$, $C_{60}$, $C_{70}$, $C_{76}$, $C_{84}$, etc. Buckminsterfullerene/Fullerenes include derivatives such as doped, functionalized (e.g. COOH or otherwise functionalized, solubilized fullerenes e.g., phenyl-$C_{61}$-butyric acid methyl ester (PCBM), and derivatives thereof, and polymerized fullerenes or combinations thereof as well as fullerene-like molecular cages with or without carbon.

Charge-transfer Material generally refers to a material, such as a conductor or semiconductor that can transport electrical charge.

Column refers to a substantially solid cylinder of material.

Complementary charge-transfer properties: As used herein, a first and second semiconductor or conductor materials are said to have complementary charge-transfer properties with respect to each other when the first material is a hole-acceptor and/or hole-transporter with respect to the second and the second is an electron-acceptor and/or electron-transporter with respect to the first or vice versa. Two materials can have complementary charge-transfer properties if they have different electron affinities.

Cone refers to shape having symmetry about an axis and a tapering cross-section.

Cylinder refers to a shape having symmetry about an axis and a substantially constant cross-section.

Device: An assembly or sub-assembly having one or more layers of material.

Efficiency: For an photovoltaic device or active layer, the efficiency is the ratio of energy output (e.g., in the form of electrons) to the necessary energy input (e.g., in the form of photons).

Electrochemical refers to the process of driving a chemical reaction by passing an electric current through a reaction mixture.

Electrolysis refers to the process of driving a redox reaction in the reverse by passing an electric current through a reaction mixture.

Hole-Acceptor, Electron-Acceptor: Hole-acceptor and electron-acceptor are relative terms for describing charge-transfer between two materials. E.g., for two semiconductor materials wherein a first material has a valence band edge or highest occupied molecular orbital (HOMO) that is higher than the corresponding valence band edge or HOMO for a second material, and wherein the first material has a conduction band edge or lowest unoccupied molecular orbital (LUMO) that is higher than the corresponding conduction band edge or LUMO for the second material, the first material is a hole-acceptor with respect to the second material and the second material is an electron-acceptor with respect to the first material. A particular band edge or molecular orbital is said to be "higher" when it is closer the vacuum level.

Hybrid Organic-Inorganic, with respect to photovoltaic devices and solar cells, refers to a device that uses both organic and inorganic materials either within a layer, in different layers or some combination of both.

Includes, including, e.g., "such as", "for example", etc., "and the like" may, can, could and other similar qualifiers used in conjunction with an item or list of items in a particular category means that the category contains the item or items listed but is not limited to those items.

Inorganic Materials: Materials which do not contain carbon as a principal element. Examples include metal-oxides and mixed metal oxides. These include both conductive materials (e.g. oxides such as titania, ITO, $SnO_x$, F-doped $SnO_x$, Al-doped $ZnO_x$, $ZnO_x$, etc.) and non-conductive materials such as $AlO_x$, $SiO_x$, etc.

Layer refers to a feature characterized by a substantially greater length and/or width compared to its thickness. A layer may be composed of multiple structures in a substantially two-dimensional array or two or more sub-layers stacked on top of one another or some combination of both.

Matrix refers to a composition of matter in which two or more different arrays interdigitate, e.g., within the same layer.

Nanostructured: generally refers to the property of having features with a characteristic dimension on the order of several nanometers ($10^{-9}$ m) up to ten's of nm across.

Organic Materials: Compounds, which principally consist of carbon and hydrogen, with or without oxygen, nitrogen or other elements, except those in which carbon does not play a critical role (e.g., carbonate salts). Examples of organic materials include:

(a) Organic Dyes and pigments such as perylenes, phthalocyanines, merocyanines, terylenes and squaraines and their derivatives.

(b) Polymers: Materials consisting of large macromolecules composed of more than one repeating units. Polymers, composed of 2–8 repeating units are often referred to as oligomers. Examples of such repeating units include, e.g., dyes or pigments.

Organic Solar Cell: A type of solar cell wherein an active photoelectric layer is fabricated, either partly or entirely, using organic materials, e.g., polymers, oligomers, molecules, dyes, pigments (including mixtures).

Photovoltaic Device: A device that absorbs radiation and coverts energy from the radiation into electrical energy. Solar cells are examples of photovoltaic devices.

Pore spacing refers to the distance between neighboring pores measured e.g., in terms of the number of pores per unit area, center-to-center distance between pores or pore wall thickness.

Radiation: Energy which may be selectively applied including electromagnetic energy having a wavelength between about $10^{-14}$ and about $10^4$ meters including, for example, gamma radiation, x-ray radiation, ultraviolet radiation, visible light, infrared radiation, microwave radiation and radio waves.

Semiconductor: As used herein, semiconductor generally refers to a material characterized by an electronic bandgap typically between about 0.5 eV and about 3.5 eV.

Solar Cell: A photovoltaic device that interacts with radiation (often in the form of sunlight) impinging on the device to produce electric power/voltage/current.

Template Pore refers to a pore formed in a layer of template material

Tubule refers to a hollow tube-like structure. A tubule can be formed, e.g., within a template pore, in which case the tubule can have a symmetry axis aligned substantially along the symmetry axis of the template pore.

Tubule Pore refers to a central hollow space within a tubule that is substantially aligned along the symmetry axis of the tubule.

II. Introduction

Commonly assigned U.S. patent application Ser. Nos. 10/290,119, 10/303,665 and provisional application 60/390,904 describe device architectures wherein two different materials are regularly arrayed and wherein the presence of two different materials alternates within 1 nm to 100 nm distances. Spacing and size of the components in the solar cell active layer can be chosen to maximize the efficiency of the device. The devices that the above applications describe have oriented arrays of semiconducting nanostructured materials in a matrix of conducting or semiconducting polymeric materials. Implementations of such an architecture utilizes mesoporous templates or nano-architected porous films containing pores filled with a material having a different electron affinity than the mesoporous template or nano-architected porous film material. Commonly assigned U.S. patent application Ser. No. 10/319,406 describes a variation on this implementation wherein the mesoporous template is removed after the pores are filled. The resulting spaces between the pores are then filled with a material having complementary charge properties with respect to the material that filled the pores.

Mesoporous templates can be produced using several different techniques. For example, organic or polymeric molecules can be intercalated and/or grafted within a mineral lamellar network. Mesoporous templates can be synthesized by clectrocrystallisation of hybrid molecular assemblies, by impregnation of preformed inorganic gels, by synthesis from heterofunctional metallic alkoxides or silsesquioxannes, or through the connection of well-defined functional nanobuilding blocks. Mesoporous templates can also be fabricated by templated growth of inorganic or hybrid networks using organic molecules and macromolecules including surfactants, amines, alkyl ammonium ions, or amphiphilic molecules, as structure directing agents. Templated growth can also be done with nanoparticles followed by removal of the nanoparticles. Furthermore, mesoporous templates can be fabricated by bioengineered self-assembly, e.g., self-assembly of protein molecules for use as a deposition template, followed by removal of the template using a protease.

The inventors have applied other techniques to producing mesoporous templates. Embodiments of the present invention are directed to solar cells and other photovoltaic devices using mesoporous templates produced by these other techniques. To make the distinction clear, the mesoporous templates described below are referred to as "porous templates." Specifically, embodiments of the present invention include solar cells wherein the two materials are present in a matrix having an anodized porous template with an array of template pores.

III. General Overview

Although the following detailed description contains many specific details for the purposes of illustration, anyone of ordinary skill in the art will appreciate that many variations and alterations to the following details are within the scope of the invention. Accordingly, the exemplary embodiments of the invention described below are set forth without any loss of generality to, and without imposing limitations upon, the claimed invention.

Embodiments of the present invention provide a device structure and fabrication method using templating from an anodized porous film. In particular embodiments, anodized Aluminum may be used as a porous template from which to construct a multi-layer hybrid organic-inorganic or organic-organic PV device such as a solar electricity cell.

Although anodized porous templates are known in the art, they have not been used in hybrid organic-inorganic, dye-sensitized or organic/organic photovoltaic devices. This may be due to the fact that, to achieve the desired efficiencies, prior art cells, such as the Titania/Iodide/Triiodide based Graetzel cell (see e.g. O'Regan et al. in "A Low-cost, High-efficiency solar cell based on dye-sensitized colloidal $TiO_2$ Films", *Nature*, Vol. 353 pp 737–740, 24 Oct., 1991), have used a ruthenium dye that absorbs light only in a monolayer at the surface. Thus, these prior art cells require a total surface area per unit mass on the order of hundreds of square meters per gram. To achieve these densities with anodized porous templates with pores a few tens of nanometers in diameter would require, a template several tens of microns thick. This would lead to pore aspect ratios of order 100 or more. Such large aspect ratios are problematic in terms of filling the pores and charge recombination within the filled pores. For example, if a device were built using an Al layer several micrometers thick, filling the pores may be difficult due to the relatively long length of the channel. Even if such a thick device could be properly constructed, the charges split from the excitons forming within the active layer of the device would have a relatively long distance to migrate before they could be collected at the electrodes. This would provide ample opportunity for losses due to charge recombination.

Embodiments of the present invention use organic light absorbing and charge-splitting materials that, over a depth, e.g., of several hundred nanometers, can absorb light in the bulk of the material (unlike many inorganic materials, which typically require a greater amount of material to absorb the same amount of light as an organic material). Consequently, these embodiments can use a porous template that is much thinner, e.g., a few hundred nanometers in thickness. In these embodiments, the porous template is formed by anodizing a thin layer of metal that can be about ten times thinner than those found in the prior art. For example, many papers have been published in which the Al layer for anodization ranges from 2 to 30 micrometers. In embodiments of the present invention, by contrast, the metal layer is from about 100 nm to about 1 micrometer thick, preferably in the 200-nm to 600-nm range, e.g., about 300 nm. This is critical to optimizing device function in photovoltaic devices based on the type of architecture described herein. In particular, the much shorter charge migration path can reduce the potential for charge recombination during transport through the device, allowing a greater number of charges to be collected at the electrodes, which improves device efficiency.

The device architecture described herein provides improved matrixed nanostructures for both charge-splitting and charge transport in the solar cell. The invention is particularly useful for PV cells that are manufactured in a continuous or semi-continuous roll-to-roll process, although batch-processing on a sheet-by-sheet basis is clearly within the scope of the invention.

IV. Photovoltaic Device

FIG. 1A depicts a portion of a photovoltaic device 100 according to an embodiment of the present invention. The device 100 generally includes an active layer 101 disposed between two electrodes e.g., a base electrode 110 and a transparent conducting electrode (TCE) 106 (or vice versa). An optional interface layer 104 may be disposed between the active layer 101 and the TCE 106.

The TCE 106 and base electrode 110 may be conductive electrodes or they could include non-conductive materials that provide support, e.g., for conductive layers that serve as the actual electrodes. The base electrode 110 may be in the form of a commercially available sheet material such as such as C-, Au-, Ag-, Al-, or Cu-coated Steel Foil or metal/alloy-coated plastic foils, including metal or metallized plastic substrates/foils that are planarized to reduce surface roughness. The base electrode may be pre-patterned (or patterned at a suitable stage during device fabrication) to facilitate parallel and/or series wiring of individual devices as commonly used in the fabrication of PV cell modules. In this context, pre-patterning may result in individual electrically insulated base electrode segments.

The base electrode 110 may alternatively be made from a transparent conducting material, e.g., indium tin oxide and the like disposed, e.g., on a glass or plastic substrate. The TCE 106 may be a layer of transparent conducting oxide (TCO) such as indium tin oxide (ITO) or fluorinated tin oxide ($F:SnO_2$). The TCE 106 may optionally include (either with or without a TCO) some combination of a transparent conducting polymer, a thin metal layer or an array of spaced apart wires, e.g., in the form of a mesh, grid or parallel wires. The optional interface layer 104 may be a barrier layer or an additional conducting polymer. Examples of suitable organic materials include PEDOT (Baytron), or polyaniline doped with a dopant such as polystyrene sulfonic acid (PSS).

In a particular embodiment, the interface layer 104 is poly-3,4-ethylenedioxythiophene-polystyrenesulfonic acid (PEDOT-PSS). In some embodiments, both the TCE 106 and base electrode 110 may be transparent. It is also possible to switch the locations of the TCE 106 and base electrode 110.

The active layer 101 includes a porous template 105 and first and second charge-transfer materials 107, 109. It is desirable that the template be made from a material that is transparent in the visible and near IR light ranges. In a preferred embodiment, the porous template is made of Alumina (aluminum oxide). Alternatively, the porous template 105 can be made from Titania (titanium oxide—$TiO_2$) or another metal oxide or other oxide. For example, the template 105 can be made of Silica ($SiO_2$), zinc oxide ($ZnO_2$), zirconium oxide, lanthanum oxide, niobium oxide, tungsten oxide, tin oxide, indium tin oxide (ITO), strontium oxide, calcium/titanium oxide, indium oxide, vanadium oxide, zirconium oxide, molybdenum oxide, as well as blends of two or more such materials. The template 105 can be formed by oxidizing a layer of metal 108 (e.g., aluminum or titanium) disposed on a surface of the base electrode 110. For purposes of illustration, a portion of the metal layer 108 is shown between the template 105 and the base electrode 110. It is also possible, and often desirable, to oxidize the entire metal layer 108 so that the porous template 105 extends all the way to the base electrode 110.

Preferably, the template 105 contains template pores 103, which may be distributed in a substantially uniform fashion, although exact uniform pore spacing, pore shape or pore size are not strictly required. The template pores 103 can be substantially cylindrical in shape. Alternatively, the template pores can have a cone-like shape, e.g., truncated cones tapering with the wider end furthest from to the layer of metal 108, i.e., towards the top of the drawing in FIG. 1A. The cone-like shape may also be reversed, i.e., with the wider openings being at the bottom and the narrower openings at the top.

The template pores 103 can be characterized by an average template pore spacing A, an average wall thickness B, and an average template pore diameter C. The average pore spacing A can be measured, e.g., from center-to-center, and can range from about 10 nm to about 500 nm, preferably between about 30 nm and about 50 nm. Since the porous template 105 principally provides structure, it is desirable to have as little template material as possible between neighboring template pores. The average wall thickness B can range from less than about 5 nm to about 40 nm, preferably less than about 20 nm. The average template pore diameter C can be in the range of several tens of nanometers, preferably about 10 nm to about 30 nm, though it is possible to form pores as small as about 2 nm and as large as about 500 nm in diameter, e.g., about 40 nm to about 100 nm. The density of the template pores 103 can range from about $10^{12}$ pores per square meter to about $3 \times 10^{15}$ pores per square meter. For template pores of a given diameter C and densities greater than about $1/C^2$ the template pores tend to overlap and merge with one another, although some degree of overlapping/merging may be acceptable. Also, the template pore diameter C may be larger than the wall thickness B between neighboring template pores 103.

The porous template 105 may be further characterized by a thickness D. The thickness D may be the thickness of the entire metal layer 108, if it is oxidized entirely, or the thickness of the portion that is oxidized. Preferably, the porous template 105 is relatively thin. For example, the thickness D may be from about 50 nm to about 500 nm thick, more preferably between about 100-nm and about 200-nm thick or between about 200 nm and about 600 nm thick.

The first charge-transfer material 107 is coated in the template pores 103 in a way that leaves behind additional space not occupied by the first charge-transfer material 107. The second charge-transfer material 109 fills the additional space. The first and second charge-transfer materials 107, 109 have complementary charge-transfer properties. In the example shown in FIG. 1A, first charge-transfer material 107 coats the walls of the template pores 103 to form tubules with the additional space being in the from of tubule pores. The second charge-transfer material 109 fills the tubule pores. Each tubule can be characterized by an outside diameter roughly equal to the diameter of the corresponding template pore 103. Each tubule pore can characterized by a tubule pore diameter d ranging from about 1 nm to about 200 nm, preferably between about 10 nm and about 200 nm, more preferably between about 10 nm to about 50 nm, still more preferably between about 20 nm and about 40 nm, most preferably about 30 nm. In general the tubule pore diameter d is less than the template pore diameter C.

As a practical matter the tubule pore diameter d represents an inner diameter for the tubule of the first charge-transfer material 107. The outer diameter for the tubule is essentially the template pore diameter C. The tubule has a wall thickness given by the half the difference between the inner and outer tubule diameters, i.e., (C–d)/2. The tubule wall thickness can range from about 0.5 nm (5 Angstroms) to about 20 nm, preferably from about 0.7 nm to about 15 nm, more preferably about 10 nm, and most preferably about 5 nm. For example, in the most preferred form, the tubule diameter C is 40 nm, the tubule pore diameter d is 30 nm, and the tubule wall thickness would be 5 nm on each side of the tubule pore, i.e., 5+30+5=40 nm across the cross-sectional diameter of the tubule.

The first charge material 107 comprising the tubule itself is preferably a conductive coating that allows electrons to leave the active layer 101. Examples of suitable materials include, e.g., metals, transparent conductive oxides such as ITO, F:SnOx other conductive oxides, organic materials such as PEDOT and doped fullerenes, e.g., doped $C_{60}$.

Examples of suitable inorganic materials that may be used as the first charge-transfer material 107 include, e.g., metal oxides such as Titania ($TiO_2$), zinc oxide ($ZnO_2$), zirconium oxide, lanthanum oxide, niobium oxide, tin oxide, indium oxide, indium tin oxide (ITO), vanadium oxide, molybdenum oxide, strontium oxide, calcium/titanium oxide and other oxides, sodium titanate, potassium niobate, Cadmium Selenide (CdSe), Cadmium Suflide (CdS), Cadmium Telluride (CdTe), i.e. generally semiconductive materials, as well as blends of two or more such materials. Methods for deposition of such materials include sol/sol-gel methods, evaporation, sputtering, CVD, MOCVD, etc. In general, the first charge-transfer material 107 may be created via deposition or reaction or condensation from the liquid or gas phase or by physical deposition methods. Furthermore the first charge-transfer material 107 may be deposited by electro-deposition, electro-plating, ion-plating, and the like.

Furthermore, the first charge-transfer material 107 can also be an organic material such as a conductive polymer (PEDOT etc.), other organic charge transporting materials (e.g. doped $C_{60}$ or charge-transfer compounds or salts), generally conjugated organic materials, e.g., polymers (doped or not). The first charge-transfer material 107 may or may not absorb a substantial fraction of the incident light.

The second charge-transfer material 109 can be an organic material. Preferably, the second charge-transfer material 109 is an organic material that absorbs light in the bulk of the material. Examples of suitable organic materials include conjugated polymers such as poly(phenylene) and derivatives thereof, poly(phenylene vinylene) and derivatives thereof (e.g., poly(2-methoxy-5-(2-ethyl-hexyloxy)-1,4-phenylene vinylene (MEH-PPV), poly(para-phenylene vinylene), (PPV)), PPV copolymers, poly(thiophene) and derivatives thereof (e.g., poly(3-octylthiophene-2,5,-diyl), regioregular, poly(3-octylthiophene-2,5,-diyl), regiorandom, Poly(3-hexylthiophene-2,5-diyl), regioregular, poly(3-hexylthiophene-2,5-diyl), regiorandom), poly(thienylenevinylene) and derivatives thereof, and poly(isothianaphthene) and derivatives thereof. Other suitable polymers include organometallic polymers, polymers containing perylene units, poly(squaraines) and their derivatives, and discotic liquid crystals. Other suitable organic network-filling materials include organic pigments or dyes, azo-dyes having azo chromofores (—N=N—) linking aromatic groups, phthalocyanines including metal-free phthalocyanine; (HPc), perylenes, naphthalocyanines, squaraines, merocyanines and their respective derivatives, poly(silanes), poly(germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f'] diisoquinoline-1,3,8,10-tetrone.

The second charge-transfer material 109 may also include polyfluorenes and polyfluorene-based copolymers and blends, e.g. co-polymerized and/or blended with charge transporting (e.g. tri-phenyl-amines and derivatives) and/or light-absorbing compounds (e.g. fused thiophene rings and derivatives, generally hetero-atom ring compounds with or without substituents).

Figure 1B:
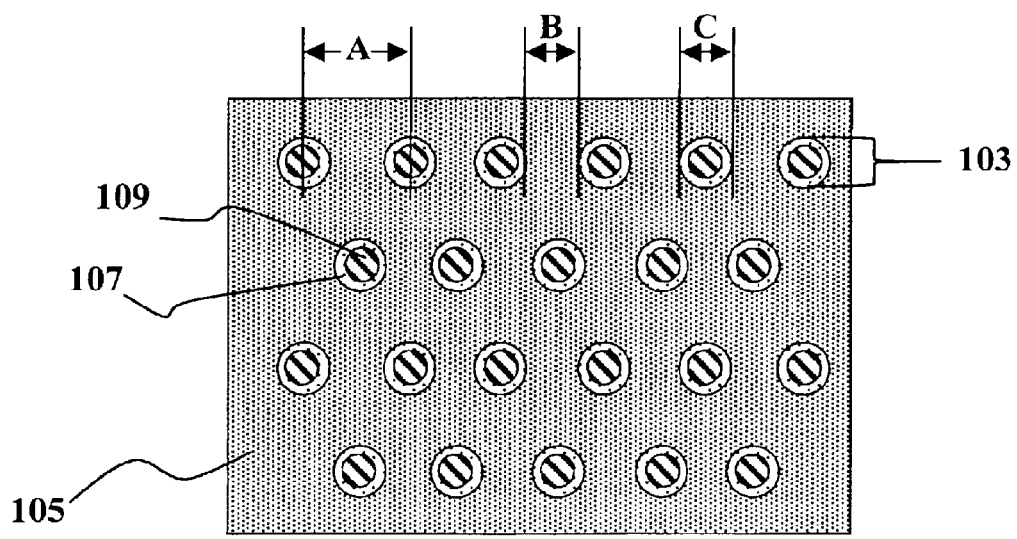
FIG. 1B is a horizontal cross-sectional schematic of the device of FIG. 1A taken along line B—B.
Figure 1C:
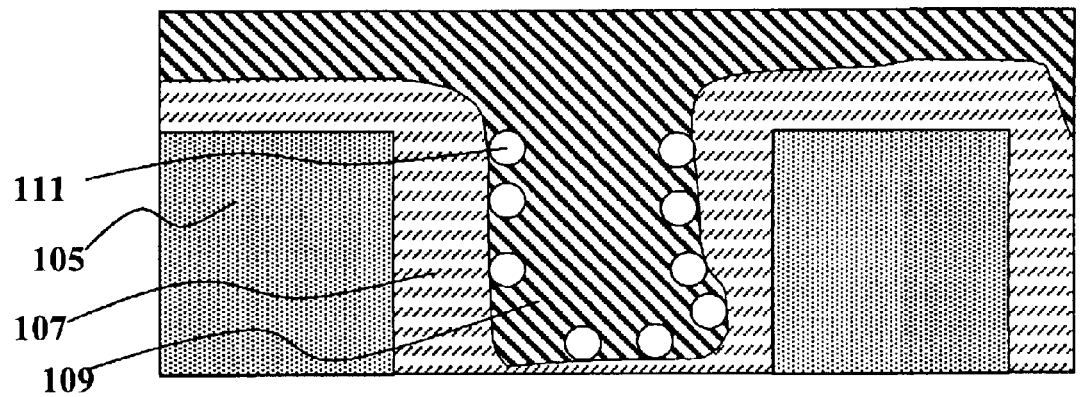
FIG. 1C is a vertical cross-sectional schematic diagram of a close-up view of a part of the device of FIG. 1A.

In a preferred embodiment, the device 100 may optionally include in the active layer 101 an interfacial layer 111 disposed between the first and second charge-transfer materials 107, 109 as shown in FIG. 1C. The interfacial layer 111 can be configured to enhance the efficiency of the device 100 in the form of one or more of (a) differential charge transfer, i.e., charge-transfer between the two materials that exhibits different rates for forward versus backward transport; (b) differential light absorption to extend a range of wavelengths that the active layer can absorb; or (c) enhanced light absorption and/or charge injection. Examples of such interfacial layers are described in detail in commonly assigned U.S. patent application Ser. No. 10/419,708, the entire disclosures of which are incorporated herein by reference.

By way of example, the interfacial layer 111 may contain organic materials attached to the first pore filling material 107. Examples of such organic materials include fullerenes (e.g., $C_{60}$, $C_{70}$ and the like), carbon nanotubes, dyes, ruthenium dyes, pigments, and organic monomers, oligomers, and polymers, any of which may be deposited singly or in combination into the porous membrane. Although the interfacial layer 111 is depicted as a monolayer in FIG. 1C, multi-layer interfacial layers may be used as well. The interfacial layer 111 may be in the form of individual molecules, monomers or oligomers or a continuous layer between materials 107 and 109.

In a particular embodiment, the interfacial layer 111 can include fullerenes. To change its chemical and electronic properties, fullerenes such as $C_{60}$ can be doped, either internally (within the molecule) or "on-site" (where one carbon atom is replaced by a (single) atom, such as a nitrogen atom, in which case the resulting $C_{59}N$ molecule is called an "azafullerene"). Doped molecules such as azafullerenes have lowered symmetry, a degenerate split of electron orbitals, and these molecules can become very reactive and have high electron affinities. More generally, the abundant unsaturated bonds in $C_{60}$ may provide for plentiful electronic states to accept electrons from potential donors. Metallic (transition metals or rare earths) or non-metallic atoms (N, P, He) can be encapsulated into the fullerene cages. Dopants which form charge-transfer salts include Na, K, Rb, Cs, Ca, Sr, B, and other alkali and alkaline earth metals, as well as organic compounds. Larger fullerenes (e.g. $C_{84}$) can incorporate larger dopants into their cages, including La, Ce, and Tm. Doping may be carried out during synthesis, so that the dopant molecule is trapped inside the cage as it forms. Fullerenes can be doped to a metallic and even superconducting state. In alkali-doped fullerenes, electrons are donated to the LUMO band. Metallic behavior is generally expected, e.g., with doped $C_{60}$. Doped $C_{60}$ with metallic character can be used in the interfacial layer of a photovoltaic device. Charge-transfer salts can also form with dopants that create an intercalated structure. Multiple dopants can be also added, increasing the range of possible physical properties.

Doped (or undoped) fullerenes such as $C_{60}$ can also be functionalized, e.g., so that they can be attached covalently to the walls of the tubule pores and/or bulk material in the porous template 105. The carbon layers in fullerenes such as $C_{60}$ may be curved due to inclusion of five-membered rings. considerable strain energy in the fullerenes is reduced when the carbon atoms of a C=C double bond are replaced by two sp3-hybridized carbon atoms. This can be exploited for functionalization of the fullerenes by addition reactions. Among the possible reactions, the reaction of $C_{60}$ with bromomalonic esters in the presence of a base, resulting in the addition of a $C(COOR)_2$ unit results in the formation of a three-membered carbon ring on the surface of the $C_{60}$ ball. Multiple additions lead eventually to hexakis-adducts with an octahedral positioning of the added units. It is also possible to attach rings to the fullerene surface by use of cyclic reactants with two active sites, depending on the size of the rings and the distance between vacant addition sites on the $C_{60}$ surface. A large variety of groups can be attached to the fullerene molecules by such reactions.

By way of example, a general method for the functionalization of fullerenes has been developed based on 1,3-dipolar cycloaddition of azomethine ylides. Further, an additional technique has been developed for a two-step synthesis of $C_{60}(OH)_{24}$, of which the first phase is bromination of $C_{60}$ to $C_{60}Br_{24}$ using elementary bromine with the catalyst $FeBr_3$. By the substitution of bromine atoms with hydroxyl groups in alkali water medium, $C_{60}(OH)_{24}$ is obtained in high yield. The hydroxyl groups can be reacted with the surface of a metal oxide, which can be appropriately functionalized.

Furthermore, the interfacial layer 111 may include fullerenes (including doped, undoped, functionalized or some combination thereof) that are polymerized, e.g., to a covalently connected string, pane, or three-dimensional arrangement of individual molecules. Fullerenes can be polymerized, for example, in a Diels-Alder (2+2) cycloaddition reaction. Polymerization can occur through any of several routes, including photo-excitation, molecular collisions, high-pressure, and high temperature, as well as simple mixing of, e.g., $C_{60}$ with alkali metals (which can cause spontaneous polymerization between $C_{60}$ molecules).

The interfacial layer 111 may also include chemicals that can covalently attach to the first charge-transfer material 107, e.g., a silane, and thus change the surface energy and/or bonding trap-states and/or attach to dangling-bonds at an exposed surface of the first charge-transfer material 107 and/or introduce a dipole layer that may increase the efficiency for charge extraction and/or reduce detrimental charge recombination. Examples are functionalization with benzoic and other acids, tert-butyl-pyridine, surfactants, dye molecules, silanes and silicon compounds or their functionalized derivatives which are often used as adhesion-promoters. The surface of the first charge-transfer material 107 may also be functionalized with silylating agents for modulation of surface properties, and/or for introduction of functional groups (amine group, aliphatic group, hydroxyl, carboxylic etc.) for further surface derivitization The interfacial layer 111 may generally include organic materials. For example, the first charge-transfer material 107 could be coated with a conjugated polymer. For example, the active layer 101 could be coated with a layer of a conjugated polymer, which is then melt-infiltrated to create, via surface energy effects, the interfacial layer 111 in the form of a thin layer of a polymer coating on the first charge-transfer material 107 (see, e.g., M. Steinhart et al., Science, Vol 296, 14 Jun. 2002, p 1997. This process, or a similar process, could also be used to create the first charge-transfer material 107.

Alternatively, an interfacial layer, e.g., in the form of a conductive layer coating or a layer similar to the interfacial layer 111, may be disposed between the porous template 105 and the first charge-transfer material 107. Such a conducting layer may be a thin metal layer, e.g., made of gold or nickel. Such thin metal layers may be deposited e.g., by electroless plating and the like. When a thin metal layer is included in the interfacial layer between the porous template 105 and the first charge-transfer material 107, the thin metal layer (e.g., Ni) may be fully or partially oxidized (e.g., by some combination of temperature and exposure to air and/or oxygen or oxygen plasma or UV ozone) to form an oxide or partial oxide, e.g. NiOx. Such an oxide may still be conducting (NiOx is a high work function transparent conductive oxide) but transmit more light into the charge-transfer materials 107 and/or 109. Deposition could also be achieved, e.g., by sputtering, evaporation, MOCVD, CVD. The interfacial layer could alternatively be, e.g., a conductive oxide followed by the first charge-transfer material 107, e.g. titania.

Furthermore, the first charge-transfer material 107 and/or interfacial layer 111 may be created by self-assembly or electro-static self-assembly of materials such as PEDOT/PSS or other materials deposited from ionic/charged polymer solutions (e.g. tetra-hydrothiophene precursor polyphenylene-vinylene and derivatives).

Figure 1D:
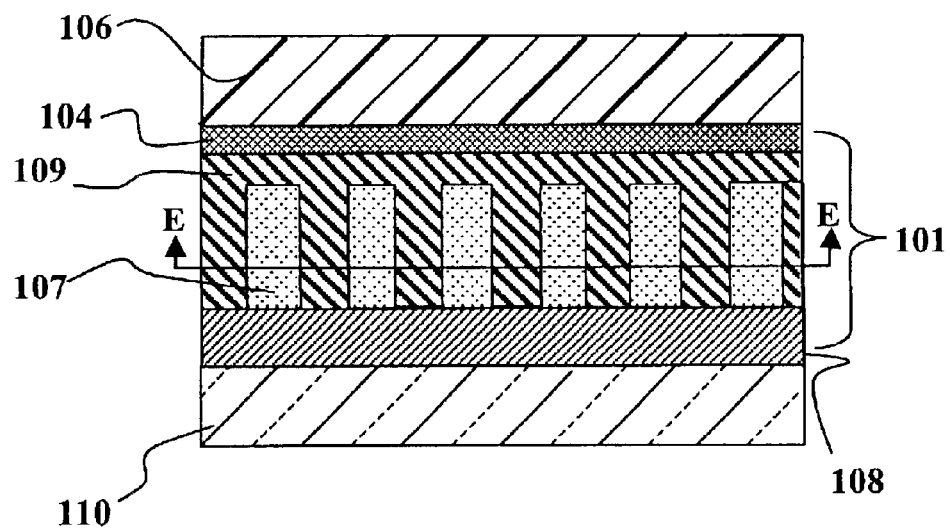
FIG. 1D is a vertical cross-sectional schematic diagram of a device according to an alternative embodiment of the present invention.
Figure 1E:
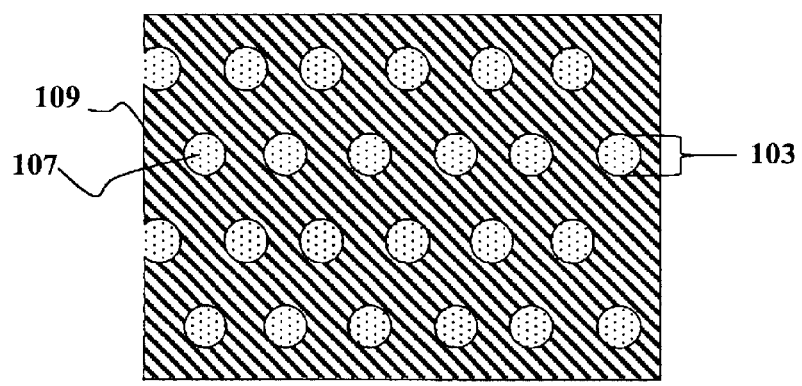
FIG. 1E is a horizontal cross-sectional schematic of the device of FIG. 1D taken along line E—E.

Another variation on the structure of FIGS. 1A–1B is depicted in FIGS. 1D–1E. In this variant structure, the porous template 105 has been removed after completely or partially filling the pores with the first charge-transfer material 107 leaving behind spaces that are subsequently filled with the second charge-transfer material 109. It is also possible to make the porous template 105 from a charge-transfer material (such as titania) thus obviating the need for a separate first charge-transfer material 107. Furthermore, although the first and second charge-transfer materials 107, 109 are described as being respectively an inorganic material and an organic material, it is possible to make the active layer 101 with the first charge-transfer material 107 organic and the second charge-transfer material 109 inorganic or with both charge-transfer materials 107, 109 being organic.

One possible way in which the first charge-transfer material 107 may be organic while the second charge transfer material is inorganic 109 is to attach a foil of an inorganic charge-transfer material, e.g. using a conductive glue, to tubules of an organic charge transfer material.

By changing the process parameters of the Aluminum anodization so that pore widening (via etching) occurs in parallel with (or after) the deepening of the pores, cone-like pores can be created that can have certain charge transport advantages. Such cone-like pores are a variant of the pores shown in FIGS. 1A–1E below. Note that pore-widening or 'cone-shaping' could also be done by other methods such as plasma-etching, reactive-ion-etching (RIE), anisotropic RIE. 'Cone-shaping' the template pores 103 may facilitate the coating of the porous template 105 with e.g. the first charge-transfer material 107 (and/or interfacial layer 111 and/or an interfacial layer between the porous template 105 and the first charge transfer material 107 as described above), particularly when the deposition method for the first charge-transfer material 107 and/or interfacial layer 111 is e.g. sputtering, evaporation or similar deposition process. Care should be taken to avoid clogging the pores at the top before the rest is filled or coated. Cone-shaping may prevent the 'clogging' of both template pores and tubule pores at various fill-stages (e.g., for filling the template pores 103 with the first charge-transfer material 107 and/or the interfacial layer 111 and/or filling the tubule pores 102 with the second charge-transfer material 109).

V. Photovoltaic Device Fabrication

Certain commercially available products can be used as the porous template 105. Examples of such products include Anapore or Anodisc filters from Whatman plc of Maidstone Kent, UK (available, e.g., through Fisher Scientific). However, these commercially available films tend to have either very large (e.g. 200 nm) or very small (e.g. 10 nm) pore sizes, and intermediate pore sizes would also be useful. Custom porous templates can also be fabricated.

Figure 2:
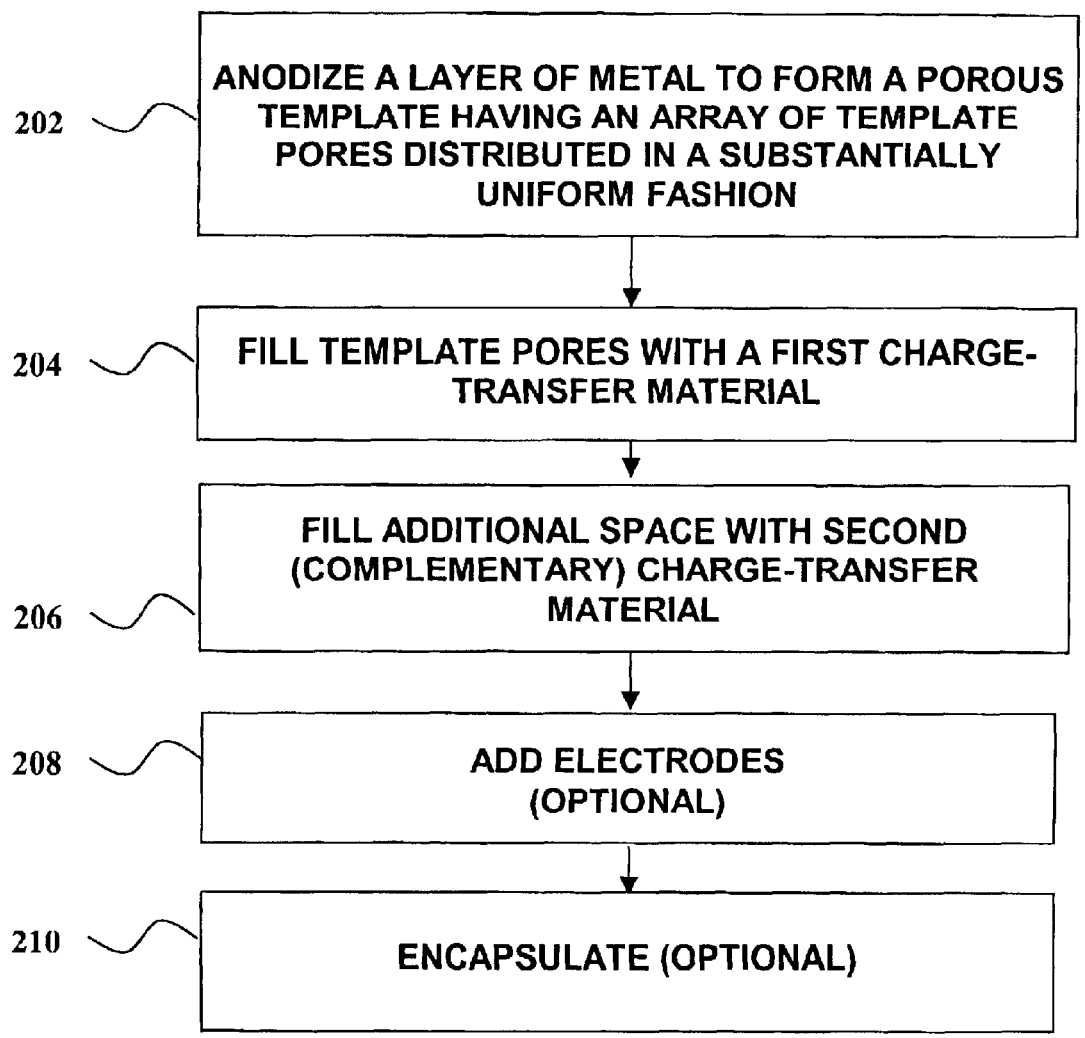
FIG. 2 is a flow diagram illustrating a method for making a device according to another embodiment of the invention.

Apparatus of the type shown in FIGS. 1A–1E can be fabricated according to embodiments of an inventive method. FIG. 2 depicts a flow diagram illustrating an example of such a method 200. Examples of how the method might be carried out are depicted in the sequences of cross-sectional diagrams depicted in FIGS. 3A–3M. The method 200 begins at 202 by anodizing a layer of metal, e.g., a metal substrate or a substrate with at least one metal coating, to form a porous template having an array of template pores distributed in a substantially uniform fashion. At 204 the pores are filled with a first charge-transfer material. At 206, a second (complementary) charge-transfer material fills additional space not occupied by the first charge-transfer material. Electrodes may optionally be added at 208 and the resulting device may optionally be encapsulated at 210.

A. Anodizing a Metal Substrate (or Coating) to form a Porous Template

Figure 3A:
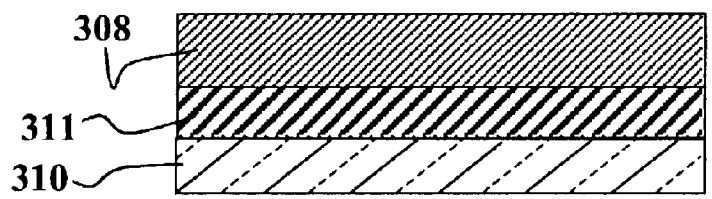
FIGS. 3A–3E depict a series of vertical cross-sectional schematic diagrams illustrating one possible sequence of steps for carrying out the method of FIG. 2.
Figure 3B:
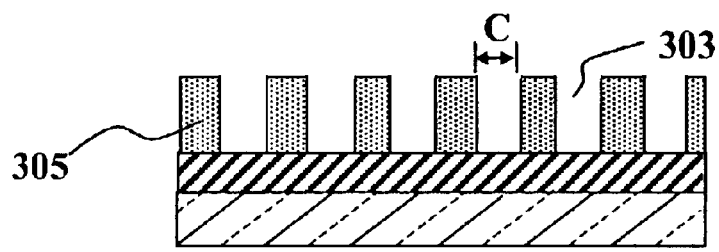
Figure 4A:
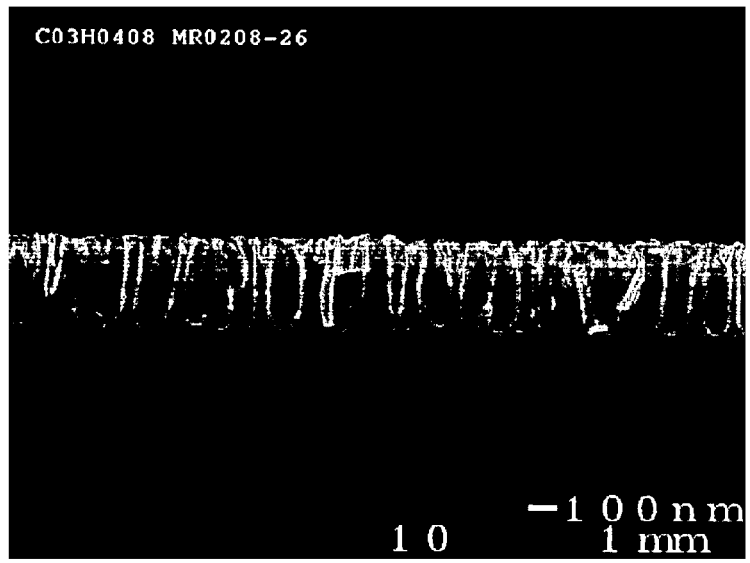
FIG. 4A depicts scanning electron microscope (SEM) image of a vertical cross-section of a porous alumina template.
Figure 4B:
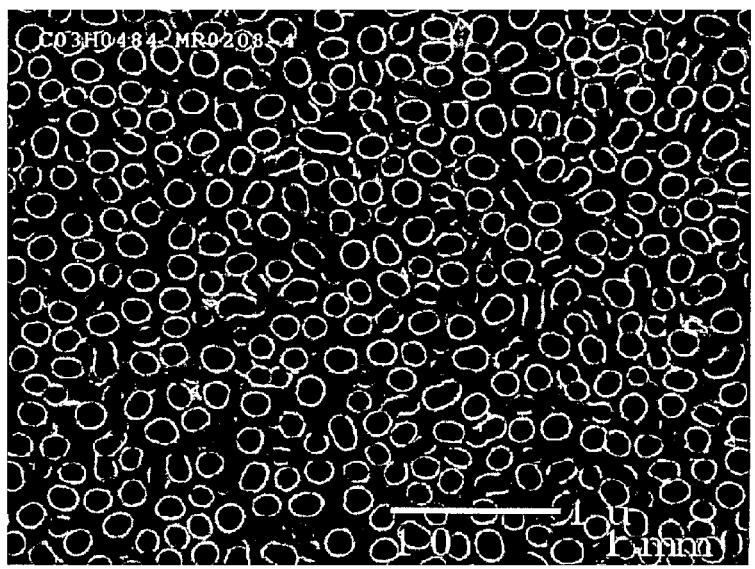
FIG. 4B depicts scanning electron microscope (SEM) image of a horizontal cross-section of a porous alumina template.

With respect to step 202 of FIG. 2, there are a number of different ways of anodize a metal substrate to form a porous template. As shown in FIGS. 3A–3B, a porous template can be anodized from a layer of metal (e.g., aluminum) 308 disposed on a substrate 310. By way of example, when aluminum is treated anodically in acid (such as a phosphoric acid) electrolyte, an oxide film 305 can be formed at the metal surface as shown in FIG. 3B. An array of template pores 303 can be formed in the oxide film 305, while the oxide film 305 is created. Where the oxide film 305 extends all the way through to the substrate 310, material at the bottom of the template pores 303 can be removed by incrementally stepping down the voltage or by chemical means. Where a portion of the metal layer 308 remains between the oxide film 305 and the substrate 310, the material at the bottom of the template pores 303 can be chemically removed or can be left in place (e.g., as an electrode). The anodizing voltage controls pore size and pore density, the amount of charge-transferred determines film thickness, and a progressive and gradual reduction in the anodizing voltage causes perforation of an aluminum oxide layer ("barrier layer") that would otherwise separate the porous film from the underlying conductive substrate. Examples of porous alumina templates made in this way are depicted in the SEM images of FIG. 4A and FIG. 4B. The SEM images of FIGS. 4A and 4B also illustrate an example of template pores distributed in a substantially uniform fashion.

The optimal thickness range for the metal layer to be anodized is from about 100 nm to about 1 micron, preferably in the 200-nm to 600-nm range, e.g., about 300 nm. Porous templates in these thickness ranges provide useful depths for proper optoelectronic function in the resulting PV device. To anodize the metal substrate (e.g. Aluminum) to its porous metal oxide equivalent (e.g. aluminum oxide, "alumina"), the anodization voltage, current, acid concentration, anodization time, and temperature can be adjusted to improve pore formation in a metal film whose thickness ranges from (for example) 250–300 nm. In particular, based on the thickness of the metal substrate, the anodization voltage, current, acid type, acid concentration, electrolyte additives, anodization time, and temperature can be adjusted to provide for a porous template with specific target dimensions.

Pore sizes in such films typically range from 10 to 250 nm, though it is also possible to form pores as small as 2 nm and as large as 500 nm. The typical pore density is about $10^{12}$ to about $3 \times 10^{15}$ pores per square meter. A film thickness of 100 to 500 nanometers is generally achieved, though films can be formed whose thickness is as small as 10 nm and as great as 50–100 micrometers.

To form the porous template, Al metal (e.g., 99.99% pure) may be coated onto a glass or metal foil substrate by use of evaporation, e-beam evaporation, sputtering, or the like. Such a film can be anodized by treatment at 160V for a specified time, e.g., on the order of several minutes, in 5–10% $H_3PO_4$ below 10° C. For instance, in a time as short as 75 min, an aluminum oxide film of roughly 30 microns thick can be generated. The potential voltage can range from about 0.001V to about 250V. Once the anodization is complete, one way, among others, to generate a perforated bottom at the base of the pores, is to step down the anodizing voltage, e.g., from 160V to 0.1 V in increments of about 0.3V or about 5% of the existing voltage, whichever is greater. The preceding protocol can result in porous alumina structures with pores in the diameter range of about 10–450 nm. To further widen the pores, anodized specimens are then immersed in a 5% (vol) phosphoric acid solution at 30° C. for 5–60 min, both to enlarge the pore size and to remove the typical barrier layer found on most anodic alumina films. In alternative embodiments the porous template 305 can be made from Titania, e.g., by anodizing a titanium foil or layer of titanium disposed on a substrate. Furthermore, it is possible to make the porous template by anodizing a metal layer to form an oxide film on glass, ITO-coated glass, F:$SnO_2$ coated glass, ITO coated PET or other plastic, or other coated or non-coated metal foils as well as metallized plastics. More specifically, the substrate 310 can be a sheet of glass or plastic or metal or a continuous foil of metal or plastic with a base electrode. The base electrode (transparent or otherwise) can be the substrate 310. A titania layer (prepared e.g. via a sol or sol-gel deposition method) may be disposed on the base electrode, followed by e.g. an aluminum layer that is later anodized. Alternatively, the base-electrode can be covered with a metal (e.g. titanium) layer followed by the to-be-anodized aluminum.

Referring to FIG. 3A an intermediate layer 311 may be disposed between the substrate/base electrode 310 and the subsequent layers, e.g., the metal layer 308 that is to be anodized, etc. This intermediate layer 311 may be a metal layer that can act as an 'anodization-stop layer' and/or act as an etch-stop layer for the pore-widening and bottom barrier layer removal etch process. Alternatively, the intermediate layer 311 may be a titania layer disposed between the substrate 310 and the subsequent layers. Such a titania layer can, after pore filling with material 309 prevent the material 309 from getting into direct contact with the bottom/base electrode. Alternatively, the intermediate layer 311 may prevent damage to the underlying substrate 310 (e.g. in case of the base electrode 110 being ITO). Very specifically, the substrate 310 could be made from a metal or alloy or stainless steel or metallized plastic foil substrate, followed by an intermediate layer, e.g., an etch-stop-layer and/or titania layer, followed by the metal layer 308 that gets anodized to create the porous template 305. The intermediate layer 311 (e.g. titania) may be particularly useful if the first charge-transfer material 307 does not go all the way down to the bottom of pores 303.

B. Filling the Pores with the First Charge-Transfer Material

With respect to 204 of FIG. 2, a variety of deposition techniques could be employed to fill the template pores 303. Such techniques include, but are not limited to, electrochemical and electroless (chemical bath) deposition, evaporation, sputtering, plating, ion-plating, molecular beam epitaxy, and sol-gel based deposition, vapor-phase deposition, metal-organic vapor phase deposition, metal-organic-vapor-phase epitaxy, self-assembly, electro-static self-assembly, melt-filling/coating, among other techniques. In the sequence shown in FIGS. 3C–3E, the first charge-transfer material 307 partly fills the template pores 303 in a way that forms tubules 301 that coat the walls of the template pores 303. The tubules 301 have tubule pores 302 left behind by the tubule forming process.

One embodiment of the present invention is the formulation of and deposition of a sol-gel into the template pores 303, followed by air-drying then heating, e.g., at 400° C. For example, a precursor solution of titanium can be mixed with ethanol, acid, acetylacetone (AcAc), and water, the resulting mixture forms a sol and the porous template is immediately dipped into this solution for 5–120 seconds. To control the deposition morphology, either deposition time or the sol temperature can be modified. For example, 5-second deposition at 15° C. (deposition at room temperature can also work) ultimately yields hollow tubules of the material being deposited, while 60-second deposition yields solid tubes of that material. Temperature can also influence the deposition process. For example, at 5° C., thin walled hollow tubes can form even when the deposition time is extended to 120 seconds, while at 20° C., solid walled tubes can form even when the deposition time is 5 seconds.

After deposition, the film is dried in air and at room temperature for thirty seconds, then the film is heated in a controlled ramp from room temperature to 400° C. in 10 to 50° C./minute increments. At 400° C., the film is held at this temperature for six hours, then ramped down from to 400° C. to room temperature in about 10 to 50° C./minute increments.

Alternatively or in parallel, UV light and/or a plasma can be exposed to the film to provide additional energy for cross-linking and thus to reduce the temperature and time requirements for the cross-linking process.

Upon heating, $TiO_2$ crystals form in the pores, e.g., with their C-axis oriented along the pore axis. After heating, if any residual sol-gel resulted in surface films forming on top of the template, mechanical polishing (e.g. using fine-grain sandpaper) can be used to remove any metal oxide deposit on either side of the film surface. Alternatively, chemical, wet-chemical or plasma etch techniques or combinations thereof can be used to remove any potential undesired surface film.

In a particular example, a $TiO_2$ sol (5 wt %) may be prepared for use in a sol-gel based tubule formation process using titanium isopropoxide (TI)—a precursor, acetylacetone (ACAC)—a condensation inhibitor, distilled water, and ethanol (EtOH)—a solvent, mixed at mole ratios ranging as follows:

ACAC/TI from about $10^{-5}$ to about 5;
Water/TI from 0 to about 20; and
EtOH/TI from about 3 to about 50.

Other condensation inhibitors and solvents may be substituted for those listed above. Furthermore the titanium isopropoxide may be replaced with another precursor compound, e.g., an alkoxide, or chloride, derived from either titanium or another central element Prior to depositing the $TiO_2$ sol, the substrate may be treated to facilitate the deposition and/or coating/wetting, e.g., by plasma cleaning, UV-Ozone cleaning, wet-chemical cleaning, and the like.

The synthesis can be carried out at room temperature in air. For sol-gel coating, porous alumina templates can be first immersed in ethanol and then dipped into a $TiO_2$ sol at room temperature for 5 sec to-20 min. A dipping device operating at a rate of about 1–10 mm/sec can control the withdrawal speed in dip coating. After drying in the air at room temperature for 1–3 h, substrates can be heated in air at about 100° C. for about 10 minutes to about 2 h and about 400° C. for about 1–3 hours, at a rate of about 1–5° C./min, to obtain porous $Al_2O_3/TiO_2$ nanostructures.

Although, the preceding example describes filling the template pores with $TiO_2$ tubules, the template pores may alternatively be filled with an organic material such as those listed above with respect to the second charge-transfer material 109.

C. Filling Additional Space with $2^{nd}$ Charge-Transfer Material

With respect to 206 of FIG. 2, there are several different ways to fill additional space not filled by the first pore-filling step in 204. For example, with respect to FIG. 3D organic charge-transfer material 309 such as a conjugated polymer (including but not limited to P3HT) can then be filled into the tubule pores 302 using capillary action melting, and/or through the assistance of surface energy or osmotic gradients. Many other organic polymers and other materials can be used, alone or in combination, at this step, such as those described above with respect to the second charge-transfer material 309. Organic charge-transfer materials can be applied to the tubule pores 302 from process solutions, e.g., by any suitable technique, e.g., web-coating, doctor blade coating, spray coating, spin coating, or a printing technique such as printing such as screen-printing, ink-jet printing, flexographic printing, gravure printing, micro-gravure printing, and the like. Heat may be applied to the nanostructured network layer and network-filling material during this step, e.g., to evaporate solvents and set the network-filling material and/or to assist material infiltration, e.g., through capillary action and/or assistance of surface energy or osmotic force.

In addition to the deposition of an organic charge-transfer material 309, an interfacial layer like interfacial layer 111 can be added. The interfacial layer can be optionally left out of the construction process, or alternatively multiple interfacial layers can be constructed within the additional space left behind after the first charge-transfer material 307 has been deposited. As described above such an interfacial layer may consist of organic materials attached to the porous membrane, including but not limited to fullerenes ($C_{60}$ and $C_{70}$ and the like), carbon nanotubes, dyes, ruthenium dyes, pigments, and organic monomers, oligomers, and polymers, any of which may be deposited singly or in combination into the porous membrane. These organic materials can be deposited using capillary action and or through osmotic gradients, using liquid solutions containing the materials to be deposited. If deposition is carried out using capillary action, gentle heating at 175° C. for 5 minutes can be used during material deposition. In addition, carbon nanotubes can be synthesized directly within the template pores 303 or the tubule pores 302 using, for example chemical vapor deposition (CVD).

Figure 3C:
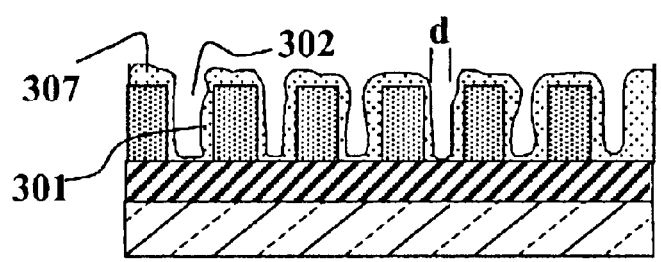
Figure 3D:
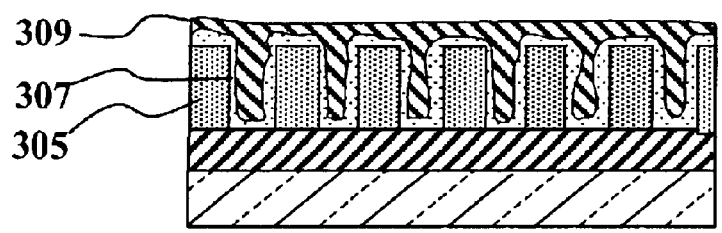
Figure 3E:
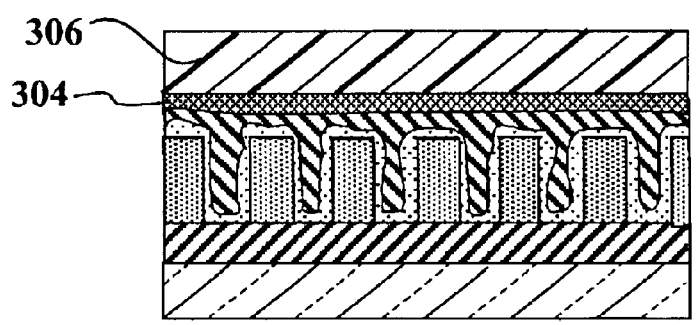

In a preferred embodiment, $TiO_2$ is formed in a porous alumina template such that the deposited material forms in a hollow tubule (e.g. as a "tube") e.g., as shown in FIG. 3C. After heating, the $TiO_2$ tubules are themselves used as a template in which to deposit an organic material such as a buckminsterfullerene, which can be covalently attached to the $TiO_2$ surface as an interfacial layer. Such a buckminsterfullerene-coated $TiO_2$ layer can be deposited either as a monolayer or in a film thicker than a monolayer, while still allowing space for additional material to be filled into the central area of the tubule. Next, a complementary charge-transfer material 309 such as P3HT is filled into the pores, e.g., by conventional coating techniques, as shown in FIG. 3D. A polymer such as PSS:PEDOT may optionally be deposited on top of the film, upon which the device is completed by either attaching a fine metal grid or evaporating a thin metal film as a top electrode as shown in FIG. 3E. The final device may be encapsulated to provide for mechanical stability and/or protection from the ambient environment.

In an alternative embodiment, multiple inorganic or organic layers are deposited, either sequentially or in parallel, resulting in multi-layer device formation within the porous template. Any of these layers could themselves be doped, either with inorganic materials or organic compounds, or mixtures of inorganic and/or organic materials, to enhance the efficiency of the device.

VI. Alternative Embodiments

Figure 3F:
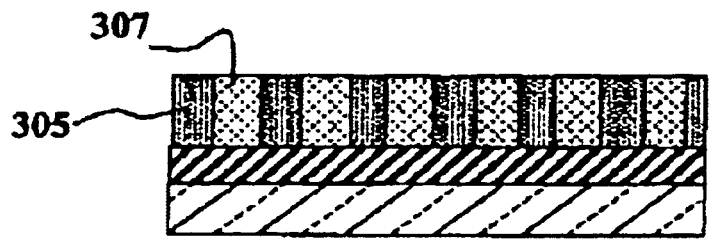
FIGS. 3F–3I depict a series of vertical cross-sectional schematic diagrams illustrating an alternative sequence of steps for carrying out the method of FIG. 2.
Figure 3G:
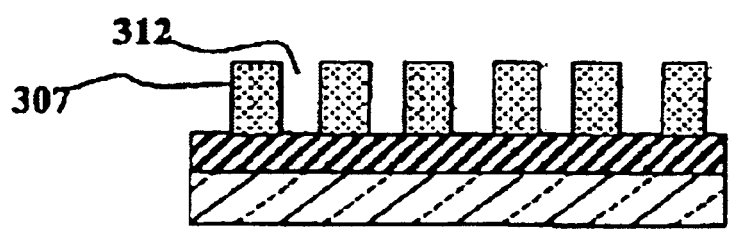
Figure 3H:
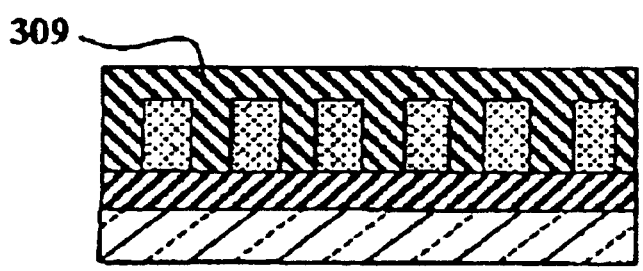

In an alternative embodiment, the additional space referred to in step 206 of FIG. 2 may be formed and filled as shown in FIGS. 3F–3I. This alternative embodiment proceeds substantially as shown and described with respect to FIG. 3A-3B. However as shown in FIG. 3F, the first charge-transfer material 307 can completely or partially fill the pores 303 in a porous template 305 made, e.g., of alumina or titania. The porous template 305 can then be removed, e.g., by immersion in 6M NaOH, followed by extensive rinsing to remove any residual base. This leaves behind an array of, structures e.g., columns or cones of the first charge-transfer material 307 with spaces 312 between the structures as shown in FIG. 3G. Then, with respect to 206, the second-charge-transfer material 309 can fill the spaces 312 between the structures of as shown in FIG. 3H. An interfacial layer having features in common with the interfacial layer 111 described above may be disposed between the first and second charge-transfer materials, e.g., before filling the spaces 312 with the second charge-transfer material 309.

Alternatively, if Titania nanotubules are sought without the surrounding Alumina template on glass, the device may be fabricated as shown in FIGS. 3A–3C. The tubule pores 302 can be filled with the second charge-transfer material 309 and the porous template 305, e.g., anodic alumina, can be removed by chemical etching e.g., in a solution containing 5% $H_3PO_4$ and 2% CrO3 at 50–75° C. for 5–10 min.

Alternatively, the tubule pores 302 once created can be preserved by removal of the porous template 305 e.g., by chemical etching e.g., in a solution containing 5% $H_3PO_4$ and 2% CrO3 at 50–75° C. for 5–10 min. and the resultant structure (tubule pores and/or the space between the tubules) can be filled with the second charge-transfer material 309. This process is one way of providing a porous template made from the second charge-transfer material 309. In effect, the second charge-transfer material 309 replaces the initial porous template 305 while substantially retaining its structure. The resulting active layer is structurally analogous to one wherein the porous template 305 is initially made from the second charge-transfer material 309.

Figure 3I:
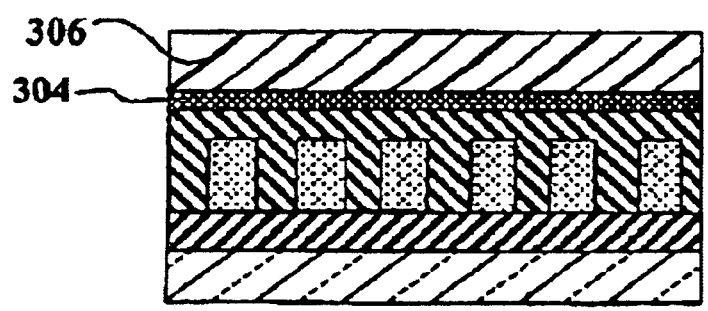

Once the spaces have been filled, the rest of a device like device 100 may be fabricated in a relatively straightforward fashion as shown in FIG. 3I. For example, a suitable process solution may be applied to provide an interface layer 304. The TCE 306 can then be attached to or deposited on the surface of the interface layer 304. The TCE 306, active layer and base electrode 310 can then be laminated between encapsulants (not shown).

In another alternative embodiment, the pores 303 can be filled with CdSe or CdTe or any other inorganic charge-transfer, semiconducting or photo-voltaic active material (e.g., through electrodeposition, sol-gel processes, chemical bath deposition or CVD etc.). Then, if the deposited material is a hollow tube, as in FIG. 3C the tubule pores 302 can be filled with an organic material (like P3HT), e.g., as shown in FIG. 3D. If the deposited material is a solid column, as in FIG. 3G, then the spaces between the columns can be filled with an organic material (like P3HT) as shown in FIG. 3H.

In another alternative embodiment, a porous template can be filled with hollow $TiO_2$ tubules then the alumina template dissolved by immersion in 6M NaOH for 10 minutes, followed by extensive rinsing to remove any residual base. The resulting columnar field of $TiO_2$ nanostructures (the "inverse structure") can then be immersed in a solution of organic material or alternatively an inorganic material can be deposited onto the columnar field. Mixtures of these techniques can be combined. For example, an alumina porous template can be filled with hollow $TiO_2$ tubules, into which a second inorganic material is deposited, after which the porous template is dissolved and an organic material then deposited onto the columnar field.

When electroless deposition is used on a porous template, columns of metal can be created that not only cross through the entire thickness of the porous channel but also cover the surface of the porous template itself in a thin layer. Such thin layers on the surface of the porous template may be used as overlayers or underlayers in the final device to decrease potential shorting and to improve electrical contacts.

Additional alternative embodiments include using different metal oxide precursors, such as zinc acetate (which ultimately forms ZnO columns in the porous template), $WCl_6$ (which ultimately forms $WO_3$), TEOS (which ultimately forms $SiO_2$), or any of a variety of other metal alkoxide precursors which each form corresponding metal oxide material in the template pores. The metal oxide precursors (and the resulting metal oxides) can be based on a central element X, which may be a transition metal, e.g., Ag, Au, Cd, Co, Cr, Cu, Fe, Ir, Mn, Mo, Nb, Ni, Sr, Ta, Ti, V, W, Y, Zn, Zr, etc. Other suitable central elements X include Al, B, Ba, Ce, Ge, Hf, In, La, Pb, Os, Se, Si, Sn, Sr, or Va.

Figure 3J:
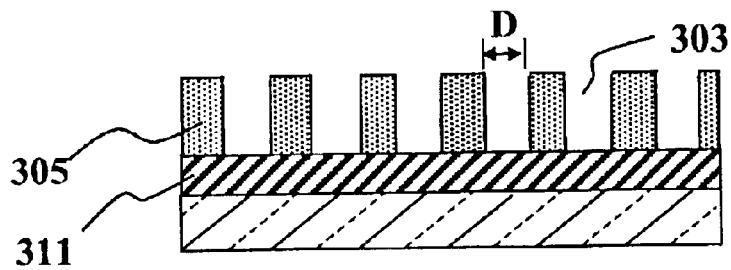
FIGS. 3J–3L depict a series of vertical cross-sectional schematic diagrams illustrating another alternative sequence of steps for making a device according to an embodiment of the present invention.

It is also possible to anodize a metal to fabricate a porous template made of an oxide or other material that is also a charge-transfer material. This would obviate the need to fill the template pores with two different charge-transfer materials. For example, a porous template 305 could be anodically fabricated from a metal layer, e.g., substantially as shown and described with respect to FIGS. 3A–3B, of Titania (TiO$_2$), an electronaccepting/transporting material. The template pores 303 can be between about 1 nm and about 100 nm in diameter and spaced apart by about 1 nm to 100 nm measured, e.g., edge to edge. The template pores 303 could stop short of penetrating all the way to the substrate 310. For example, the template pores might end at the intermediate layer 311 as shown in FIG. 3J.

Figure 3K:
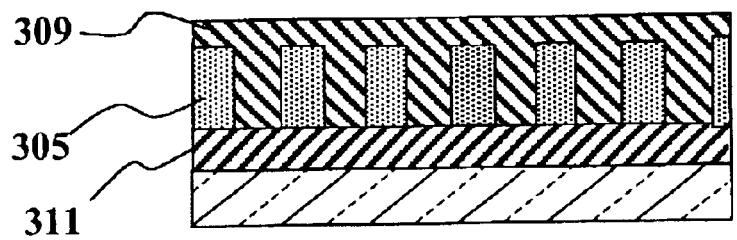
Figure 3L:
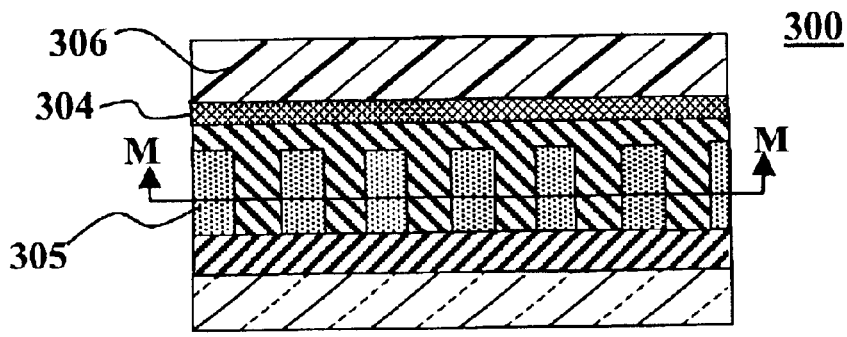
Figure 3M:
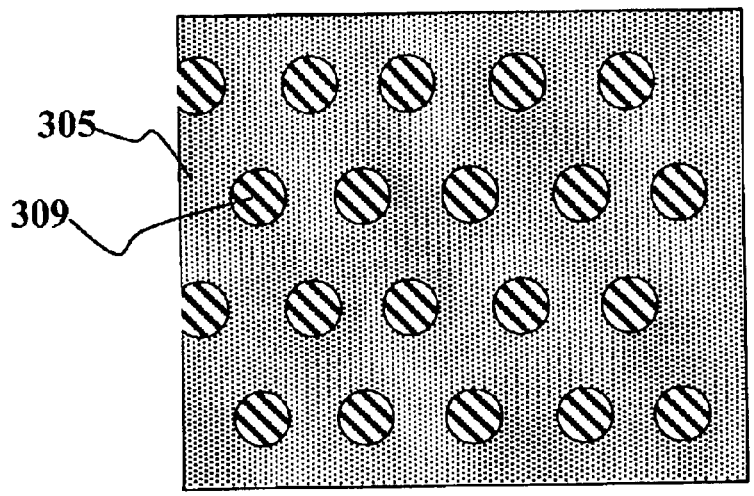
FIG. 3M depicts a horizontal cross-section taken along line M—M of FIG. 3L.

Alternatively, with or without an intermediate layer 311, where the porous template 305 is made from a charge-transfer material, the template pores 303 may be stopped short of penetrating all the way to the substrate 310 by controlling the anodization such that the template pores 303 simply stops short of penetrating all the way through the porous template 305. The template pores 303 could be then completely filled, as shown in FIG. 3K, with a charge-transfer material 309 that is a hole-acceptor, e.g., a suitable organic material described above. An interfacial layer having features in common with the interfacial layer 111 described above may be disposed between the first and second charge-transfer materials, e.g., before filling the template pores 303 with the second charge-transfer material 309. Once the template pores 303 have been filled, the rest of a device 300 may be fabricated in a relatively straightforward fashion as shown in FIG. 3L, e.g., by adding the interface layer 304, 306 and optional encapsulants (not shown). A horizontal cross-section of the resulting device 300 is shown in FIG. 3M.

Alternatively, post-treatment of the porous template 305 via an oxidation or reduction process or a doping process (furnace doping, gas phase doping, implantation, solution doping, etc.) can change the stoichiometry and/or composition of the porous template 305 after the anodization in order to tune (e.g. increase) the absorption of the porous template 305 and, more importantly, to be able to tune the conductivity of the porous template 305, e.g. in the case of an alumina template, to render the insulating aluminum oxide to provide the desired complementary charge-transfer properties with respect to the charge-transfer material 309.

In other alternative embodiments, variations on the fabrication sequence shown in FIGS. 3A–3F are within the scope of the present invention. For example, the device fabrication may proceed as shown in FIGS. 3A–3B. Then, a substrate or foil pre-coated with the remaining layers may be laminated over the porous template 305 to create the finished device. Alternatively, fabrication may proceed up to filling the template pores 303 as shown in FIG. 3C or filling the tubule pores 302 as in FIG. 3D or forming the interface layer 304 before laminating the remaining layers.

In another alternative embodiment, fabrication may proceed as shown in FIGS. 3A–3C. The first charge-transfer material 307 in 3C may clog the tops of template pores 303, thereby creating a continuous over layer of the first charge-transfer material 307. The partially completed device including the porous template 305 and first charge-transfer material 307 could then be laminated to another substrate having the remaining layers pre-coated (or the remaining layers could be deposited onto the continuous over layer of the first charge-transfer material 307). Then, by lamination, all these layers may be transferred from the substrate 310 to a second substrate and finished from the side that formerly faced the substrate 310. This can be very useful, e.g., if certain substrates/coatings are very useful for creating the porous template but are not so suitable in the final PV device. In effect part of the steps up to the anodized porous layer 305 (and perhaps further) would be completed on the substrate 310. The partially completed device would be transferred to the final device substrate to complete the fabrication.

A specific example of the preceding alternative embodiment could be useful, e.g., if the anodization process is difficult to do or control on flexible substrates: The anodization, i.e. creation of the porous template 305 with or without some additional coating, treatment, or fill steps could be done, e.g., on rigid sheets of glass. The porous template and other layers could then be transferred to a flexible roll-to-roll final substrate to finish the device. An additional advantage in this case is that one could re-use the initial substrate 310 on which the porous template was formed.

Although in many of the embodiments listed above it is often implied that the first charge transporting materials (e.g. 107) and the bottom electrode (e.g. 110) assume the roles of electron-transporter/acceptor/collector and the second material (e.g. 109) assumes the role of the opposite positive charge carrier transporter/acceptor/collector and the TCE 106 assumes the role of an anode, it is clearly within the scope of this invention that this could be reversed. For example, the base electrode 110 could be an anode. The first charge-transfer material 107 and/or interfacial layer 111 and or any additional conductive layers between the porous template 105 and first charge-transfer material 107 could act as positive charge carrier transporters/acceptors/collectors. The, e.g., organic (or inorganic) second charge-transfer material 109 could be a negative charge carrier transporters/acceptors/collectors, together with the TCE 106 and/or interface layer 104 serving as a cathode. This includes cases in which the porous template material itself (e.g. 105) has advantageous conductive and/or positive charge carrier extracting/conducting properties. Another example would be one in which, e.g., the interfacial layer 111 is e.g. PEDOT/PSS (acting as anode that contacts down through the template pores to the base electrode 110) followed by e.g. a donor/acceptor organic blend filled into the pores or a bi-layer structure with a hole acceptor/transporter layer on top of 111 with the remaining pore volume filled with an electron acceptor/transporter.

VII. Conclusion

Embodiments of the present invention allow for large-scale, low-cost production of photovoltaic devices, such as solar cells or other devices.

While the above is a complete description of the preferred embodiment of the present invention, it is possible to use various alternatives, modifications and equivalents.

What is claimed is:

1. A solar cell device, comprising two or more materials having different electron affinities, the solar cell device being characterized by an architecture
   wherein the two or more materials are regularly arrayed and wherein the presence of the two or more materials alternates within distances of between about 1 nm and about 100 nm,
   wherein the two or more materials are present in a porous template with an array of template pores, wherein the porous template has been made by anodizing a layer of metal,
   wherein one of the materials in the matrix is an organic material that can absorb light in the bulk of the organic material; and wherein the two or more materials are disposed between a base electrode and a transparent conducting electrode.

2. A photovoltaic device, comprising:
a porous template of anodized metal having an array of template pores;
a first charge-transfer material that at least partially fills the template pores, a second charge transfer material that fills additional space not occupied by the first charge-transfer material, wherein the first charge-transfer material has complementary charge-transfer characteristics with respect to the porous template;
a base electrode; and
a transparent conducting electrode (TCE),
wherein the first and second charge-transfer materials are disposed between the base electrode and the TCE.

3. The device of claim 2 wherein at least one of the first and second charge-transfer materials is an organic material that can absorb light in the bulk of the organic material.

4. The device of claim 2 wherein the template pores are between about 2 nm and about 500 nm in diameter, or between about 40 nm and about 100 nm in diameter or between about 10 nm and about 30 nm in diameter.

5. The device of claim 2 wherein the template pores are spaced apart by an average distance of between about 10 nm to about 500 nm center-to-center, or between about 30 nm and about 50 nm center-to center.

6. The device of claim 2 wherein an average wall thickness between neighboring template pores is less than about 5 nm, or less than about 20 nm, or between about 5 nm and about 40 nm.

7. The device of claim 2 wherein the template pores are present in the porous template with a pore density between about $10^{12}$ and about $3 \times 10^{15}$ pores per square meter.

8. The device of claim 2 wherein the template pores have an average wall thickness of between about 0.5 nm and about 20 nm.

9. The device of claim 2 wherein the porous template is made from the second charge transfer material.

10. The device of claim 9 wherein the template pores stop short of penetrating all the way through the porous template.

11. The device of claim 2 wherein the porous template has been formed by anodizing a layer of metal.

12. The device of claim 11 wherein the metal is aluminum or titanium, whereby the porous template is made of alumina or titania.

13. The device of claim 11 wherein the porous template is made of titania ($TiO_2$), silica ($SiO_2$), zinc oxide ($ZnO_2$), zirconium oxide, lanthanum oxide, niobium oxide, tungsten oxide, tin oxide, indium oxide, indium tin oxide (ITO), strontium oxide, vanadium oxide, molybdenum oxide, calcium/titanium oxide, or blends of two or more such materials.

14. The device of claim 2 wherein the first charge-transfer material includes, a metal, a transparent conductive oxide, indium tin oxide (ITO), fluorinated tin oxide ($F:SnO_x$), a conductive oxide, $TiO_2$, an organic material, PEDOT, a doped fullerene, or doped $C_{60}$.

15. The device of claim 2 wherein at least one of the first and second charge-transfer materials includes a material chosen from the group of poly(phenylene) and derivatives thereof, poly(phenylene vinylene) and derivatives thereof, poly(2-methoxy-5-(2-ethyl-hexyloxy)-1,4-phenylene vinylene)(MEH-PPV), poly(para-phenylene vinylene) (PPV), PPV copolymers, poly(thiophene) and derivatives thereof, regioregular poly(3-octylthiophene-2,5,-diyl), regiorandom poly(3-octylthiophene-2,5,-diyl), poly (3-hexylthiophene) (P3HT), regioregular poly(3-hexylthiophene-2,5-diyl), regiorandom poly(3-hexylthiophene-2,5-diyl), poly(thienylenevinylene) and derivatives thereof, poly(isothianaphthene) and derivatives thereof, tetra-hydro-thiophene precursors and derivatives thereof, organometallic polymers, polymers containing perylene units, poly(squaraines) and their derivatives, discotic liquid crystals, polyfluorenes, polyfluorene copolymers, polyfluorene-based copolymers and blends co-polymerized and/or blended with charge transporting and/or light-absorbing compounds, tri-phenyl-amines and derivatives, fused thiophene rings and derivatives, and hetero-atom ring compounds with or without substituents.

16. The device of claim 2, wherein at least one of the first and second charge-transfer materials is a pigment or dye chosen from the group of organic pigments or dyes, azo-dyes having azo chromofores (—N=N—) linking aromatic groups, phthalocyanines including metal-free phthalocyanine (HPc), perylenes, naphthalocyanines, squaraines, merocyanines and their respective derivatives, poly(silanes), poly (germinates), 2,9-Di(pent-3-yl)-anthra[2,1,9-def:6,5,10-d'e'f']diisoquinoline-1,3,8,10-tetrone, and 2,9-Bis-(1-hexyl-hept-1-yl)-anthra[2,1,9-def:6,5,10-d'e'f']diisoquinoline-1,3,8,10-tetrone.

17. The device of claim 2 further comprising, an interfacial layer disposed between the first and second charge-transfer materials.

18. The device of claim 17 wherein the interfacial layer includes one or more materials chosen from the group of fullerenes, doped fullerenes, functionalized fullerenes, doped functionalized fullerenes, azafullerenes, polymerized fullerenes (doped or undoped), functionalized polymerized fullerenes (doped or undoped), carbon nanotubes, dyes, ruthenium dyes, pigments, organic monomers, oligomers, and polymers, tetra-hydrothiophene precursor polymers and derivatives thereof, and poly-phenylene-vinylene and derivatives thereof, and conjugated polymers.

19. The device of claim 17 wherein the interfacial layer includes one or more chemicals that can covalently attach to the first charge-transfer material and change a surface energy of the first charge transfer material, one or more chemicals that can covalently attach to the first charge-transfer material and change bonding of the first charge transfer material, one or more chemicals that can covalently attach to the first charge-transfer material and change trap-states of the first charge transfer material one or more chemicals that can attach to dangling-bonds at an exposed surface of the first charge-transfer material, one or more chemicals that can introduce a dipole layer that may increase the efficiency for charge extraction, and/or one or more chemicals that can reduce detrimental charge recombination.

20. The device of claim 2 wherein a surface of the first charge-transfer material is functionalized with one or more silylating agents.

21. The device of claim 2 wherein the template pores have substantially cylindrical, cone, or truncated cone shapes.

22. The device of claim 2 wherein the porous template is between about 50 nm and about 1 micron thick.

23. The device of claim 22 wherein the porous template is between about 100 nm and about 200 nm thick or between about 200 nm and about 600 nm thick.

24. The device of claim 2 wherein the first charge-transfer material is in the form of one or more tubules disposed in the template pores, each tubule having a tubule pore.

25. The device of claim 24 wherein the second charge-transfer material fills the tubule pores.

26. The device of claim 24 wherein the tubule pores have an average diameter between about 1 nm and about 200 nm or between about 1 nm and about 100 nm, or between about 10 nm and about 50 nm, or between about 20 nm and about 40 nm or about 30 nm.

27. The device of claim 2 further comprising an intermediate layer disposed between the porous template and the base electrode.

28. The device of claim 2 further comprising an interfacial layer disposed between the porous template and the first charge-transfer material.

29. The device of claim 28, wherein the interfacial layer includes one or more conductive layers, one or more metal layers, nickel or oxides thereof or gold.

30. A method for making a photovoltaic device, comprising:
anodizing a layer of metal to form a porous template charge-transfer material having an array of template pores; and
filling the template pores with a first charge-transfer materials that has charge-transfer properties complementing to the porous template.

31. The method of claim 30 wherein the template pores are between about 2 nm and about 500 nm in diameter, or between about 40 nm and about 100 nm in diameter or between about 10 nm and about 30 nm in diameter.

32. The method of claim 30 wherein the template pores are spaced apart by an average distance of between about 10 nm to about 500 nm center-to-center, or between about 30 nm and about 50 nm center-to center.

33. The method of claim 30 wherein an average wall thickness between neighboring pores is less than about 5 nm, or less than about 20 nm, or between about 5 nm and about 40 nm.

34. The method of claim 30 wherein the template pores are present in the porous template with a pore density between about $10^{12}$ and about $3 \times 10^{15}$ pores per square meter.

35. The method of claim 30 wherein the first charge-transfer material is an organic material that can absorb light in the bulk of the organic material.

36. The method of claim 30 wherein the first charge-transfer material includes a material chosen from the group of poly(phenylene) and derivatives thereof, poly(phenylene vinylene) and derivatives thereof, poly(2-methoxy-5-(2-ethyl-hexyloxy)-1,4-phenylene vinylene)(MEH-PPV), poly (para-phenylene vinylene) (PPV), PPV copolymers, poly (thiophene) and derivatives thereof, regioregular poly(3-octylthiophene-2,5,-diyl), regiorandom poly(3-octylthiophene-2,5,-diyl), poly (3-hexylthiophene) (P3HT), regioregular; poly(3-hexylthiophene-2,5-diyl), regiorandom poly(3-hexylthiophene-2,5-diyl), poly(thienylenevinylene) and derivatives thereof, poly(isothianaphthene) and derivatives thereof, tetra-hydro-thiophene precursor polymers and derivatives thereof, organometallic polymers, polymers containing perylene units, poly(squaraines) and their derivatives, polyfluorene copolymers and discotic liquid crystals,
or a pigment or dye chosen from the group of organic pigments or dyes, azo-dyes having azo chromofores (—N=N—) linking aromatic groups, phthalocyanines including metal-free phthalocyanine (HPc), perylenes, naphthalocyanines, squaraines, merocyanines and their respective derivatives, poly(silanes), poly(germinates), 2,9-Di(pent-3-yl)-anthra[2,1,9-def:6,5,10-d'e'f'] diisoquinoline-1,3,8,10-tetrone, and 2,9-Bis-(1-hexyl-hept-1-yl)-anthra[2,1,9-def:6,5,10-d'e'f'] diisoquinoline-1,3,8,10-tetrone.

37. The method of claim 30 wherein the porous template is between about 50 nm and about 1 micron thick.

38. The method of claim 30 wherein the porous template is between about 100 nm and about 200 nm thick or between about 200 nm and about 600 nm thick.

39. The method of claim 30 further comprising, disposing an interfacial layer between the porous template and the first charge-transfer material.

40. The method of claim 39 wherein the interfacial layer includes one or more materials chosen from the group of fullerenes, doped fullerenes, functionalized fullerenes, doped functionalized fullerenes, azafullerenes, polymerized fullerenes (doped or undoped), functionalized polymerized fullerenes (doped or undoped), carbon nanotubes, dyes, ruthenium dyes, pigments, organic monomers, oligomers and polymers, tetra-hydro-thiophene precursor polymers and derivatives thereof, poly-phenylene-vinylene and derivatives thereof, or, if the interfacial layer is disposed between the porous template and the first charge-transfer material, conductive layers, metal layers, nickel, oxides thereof, or gold.

41. The method of claim 30 wherein anodizing a layer of metal to form a porous template includes:
placing an aluminum, aluminum-coated, titanium or titanium-coated substrate in an electrolyte, and applying an anodizing voltage to the substrate to form an alumina or titania film.

42. The method of claim 30, further comprising and incrementally stepping down an anodizing voltage.

43. The method of claim 30, further comprising substantially removing a barrier between the template pores and an underlying layer.

44. The method of claim 30, further comprising widening the template pores.

45. The method of claim 30 wherein the template pores stop short of penetrating all the way through the porous template.

46. The method of claim 30 wherein filling additional space not occupied by the first charge-transfer material includes anodizing the metal layer to form the porous template such that the porous template is made of a material having complementary charge-transfer properties with respect to the first charge-transfer material, whereby the material of the porous template is the second charge-transfer material.

47. The method of claim 30 further comprising disposing an intermediate layer between the layer of metal and an underlying substrate.

48. The method of claim 47 wherein the intermediate layer is configured to act as an anodization-stop layer and/or act as an etch-stop layer.

49. The method of claim 30, further comprising:
filling additional space not occupied by the first charge-transfer material with a second charge-transfer material that is complementary to the first charge-transfer material.

50. A method for making a photovoltaic device, comprising:
anodizing a layer of metal to form a porous template having an array of template pores;
filling the template pores with a first charge-transfer material; and
filling additional space not occupied by the first charge-transfer material with a second charge-transfer material that is complementary to the first charge-transfer material,
wherein filling the template pores with a first charge-transfer material includes:

partly filling one or more of the template pores with the first charge-transfer material to form one or more tubules wherein the additional space is a tubule pore in each tubule.

51. The method of claim 50 wherein the tubule pores have an average wall thickness of between about 0.5 nm and about 20 nm.

52. The method of claim 50 wherein the tubule pores have an average diameter between about 1 nm and about 200 nm or between about 1 nm and about 100 nm, or between about 10 nm and about 50 nm, or between about 20 nm and about 40 nm or about 30 nm.

53. The method of claim 50 wherein the tubules are formed by depositing a sol-gel into the template pores, followed by air drying then heating.

54. The method of claim 53 further comprising adjusting a deposition temperature of the sol-gel and or a deposition time such that tubules form.

55. The method of claim 54, further comprising adjusting a chemical or physical property of the porous template such that tubules form.

56. The method of claim 50 wherein filling additional space not occupied by the first charge-transfer material includes:

filling the tubule pore of one or more of the tubules with the complementary charge-transfer material.

57. The method of claim 56, further comprising removing the porous template leaving behind structures made of the first and second charge-transfer materials with spaces between the structures.

58. A method for making a photovoltaic device, comprising:

anodizing a layer of metal to form a porous template having an array of template pores;

filling the template pores with a first charge-transfer material; and filling additional space not occupied by the first charge-transfer material with a second charge-transfer material that is complementary to the first charge-transfer material, wherein filling the template pores with a first charge-transfer material includes completely filling the pores with the first charge-transfer material and removing the porous template leaving behind structures of the first charge-transfer material with spaces between the structures.

59. The method of claim 58 wherein filling additional space not occupied by the first charge-transfer material includes filling the spaces between the structures of the first charge-transfer material with the complementary charge-transfer material.

* * * * *